United States Patent
Kim et al.

(10) Patent No.: US 12,171,132 B2
(45) Date of Patent: Dec. 17, 2024

(54) DISPLAY DEVICE

(71) Applicant: Samsung Display Co., Ltd., Yongin-si (KR)

(72) Inventors: Kwanghyeok Kim, Cheonan-si (KR); Miyoung Kim, Hwaseong-si (KR); Soyeon Park, Yongin-si (KR); Yong-Hwan Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/523,832

(22) Filed: Nov. 29, 2023

(65) Prior Publication Data

US 2024/0099096 A1 Mar. 21, 2024

Related U.S. Application Data

(63) Continuation of application No. 17/981,453, filed on Nov. 6, 2022, now Pat. No. 11,871,639, which is a
(Continued)

(30) Foreign Application Priority Data

May 25, 2020 (KR) .......................... 10-2020-0062185

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0446* (2019.05); *H10K 50/844* (2023.02); *H10K 59/131* (2023.02)

(58) Field of Classification Search
CPC .. G06F 3/0412; G06F 3/04164; G06F 3/0446; G06F 3/0443; G06F 2203/04112;
(Continued)

(56) References Cited

U.S. PATENT DOCUMENTS 10,579,174 B2  3/2020  Kim et al.
10,635,211 B2  4/2020  Kim et al.
(Continued)

FOREIGN PATENT DOCUMENTS

EP   3 623 918   3/2020
EP     20 900    3/2020
(Continued)

OTHER PUBLICATIONS

Non-Final Office Action dated Mar. 10, 2022, issued to U.S. Appl. No. 17/137,326.
(Continued)

*Primary Examiner* — Deeprose Subedi
(74) *Attorney, Agent, or Firm* — Lewis Roca Rothgerber Christie LLP

(57) ABSTRACT

A display device includes a display panel and an input detection layer including sensing electrodes disposed on the display panel, and trace lines electrically connected to the sensing electrodes, respectively, in which at least one of the trace lines includes a single layer part, and a multilayer part, a length of an $i^{th}$ trace line and a length of a $j^{th}$ trace line are different from each other, each of the $i^{th}$ trace line and the $j^{th}$ trace line includes the single layer part and the multilayer part, and a length of the single layer part of the $i^{th}$ trace line is substantially equal to that of the single layer part of the $j^{th}$ trace line, and a length of the multilayer part of the $i^{th}$ trace line is different from that of the multilayer part of the $j^{th}$ trace line.

17 Claims, 15 Drawing Sheets

Related U.S. Application Data continuation of application No. 17/137,326, filed on Dec. 29, 2020, now Pat. No. 11,508,788.

(51) Int. Cl.
*G06F 3/044* (2006.01)
*H10K 50/844* (2023.01)
*H10K 59/131* (2023.01)

(58) Field of Classification Search
CPC ....... G06F 2203/04111; H01L 51/5253; H01L 27/3276; H01L 27/323
See application file for complete search history.

(56) References Cited

U.S. PATENT DOCUMENTS

| | | |
|---|---|---|
| 10,949,047 B2 | 3/2021 | Na et al. |
| 10,991,771 B2 | 4/2021 | Kim et al. |
| 2012/0206402 A1 | 8/2012 | Park et al. |
| 2014/0182894 A1 | 7/2014 | Liu et al. |
| 2017/0269744 A1* | 9/2017 | Gharghi ................ G06F 3/0443 |
| 2018/0182822 A1 | 6/2018 | Seo et al. |
| 2018/0308903 A1 | 10/2018 | Jeong et al. |
| 2020/0042123 A1 | 2/2020 | Kim et al. |
| 2020/0142563 A1 | 5/2020 | Kim et al. |

FOREIGN PATENT DOCUMENTS

| | | |
|---|---|---|
| KR | 10-2012-0092365 | 8/2012 |
| KR | 10-2018-0056449 | 5/2018 |
| KR | 10-2018-0119196 | 11/2018 |
| KR | 10-1929729 | 12/2018 |
| KR | 10-2020-0015872 | 2/2020 |

OTHER PUBLICATIONS

Notice of Allowance dated Jul. 19, 2022, issued to U.S. Appl. No. 17/137,326.

Non-Final Office Action dated May 22, 2023, issued to U.S. Appl. No. 17/981,453.

Notice of Allowance dated Aug. 30, 2023, issued to U.S. Appl. No. 17/981,453.

* cited by examiner

DISPLAY DEVICE

CROSS-REFERENCE TO RELATED APPLICATIONS

This application is a continuation of U.S. patent application Ser. No. 17/981,453, filed on Nov. 6, 2022, which is a continuation of U.S. patent application Ser. No. 17/137,326, filed on Dec. 29, 2020, now issued as U.S. Pat. No. 11,508,788, which claims priority from and the benefit of Korean Patent Application No. 10-2020-0062185, filed on May 25, 2020, each of which is hereby incorporated by reference for all purposes as if fully set forth herein.

BACKGROUND

Field

Embodiments of the invention relate generally to a display device, and, more specifically, to a display device having a reduced bezel width.

Discussion of the Background

Various electronic devices such as smart phones, tablets, notebook computers, and smart televisions are being developed. These electronic devices include a display device for providing information. The electronic devices further include various electronic modules in addition to the display device.

The display device may include a display panel for displaying an image and an input detection unit that senses an external input.

The above information disclosed in this Background section is only for understanding of the background of the inventive concepts, and, therefore, it may contain information that does not constitute prior art.

SUMMARY

Display devices constructed according to embodiments of the invention are capable of reducing bezel width and suppressing reduction of sensing accuracy.

Additional features of the inventive concepts will be set forth in the description which follows, and in part will be apparent from the description, or may be learned by practice of the inventive concepts.

A display device according to an embodiment includes a display panel including a light emitting element that generates light and an input detection layer disposed on the display panel. The input detection layer includes a plurality of sensing electrodes disposed on the display panel and arranged in one direction, and a plurality of trace lines electrically connected to the plurality of sensing electrodes, respectively. At least one trace line among the plurality of trace lines includes a single layer part including one conductive layer and a multilayer part including at least two conductive layers disposed on different layers.

A display device according to another embodiment includes a display panel including a light emitting element that generates light and an input detection layer disposed on the display panel. The input detection layer includes a plurality of first sensing electrodes, a plurality of second sensing electrodes, a plurality of first trace lines and a plurality of second trace lines. The first and second sensing electrodes are disposed on the display panel. The first sensing electrodes extend in a first direction and are arranged in a second direction intersecting the first direction. The second sensing electrodes extend in the second direction and are arranged in the first direction. The first trace lines are electrically connected to the first sensing electrodes, respectively, and the second trace lines are electrically connected to the second sensing electrodes, respectively. At least one trace line among the plurality of first and second trace lines includes: a single layer part including one wiring layer; and a multilayer part including at least two wiring layers disposed on different layers.

It is to be understood that both the foregoing general description and the following detailed description are and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
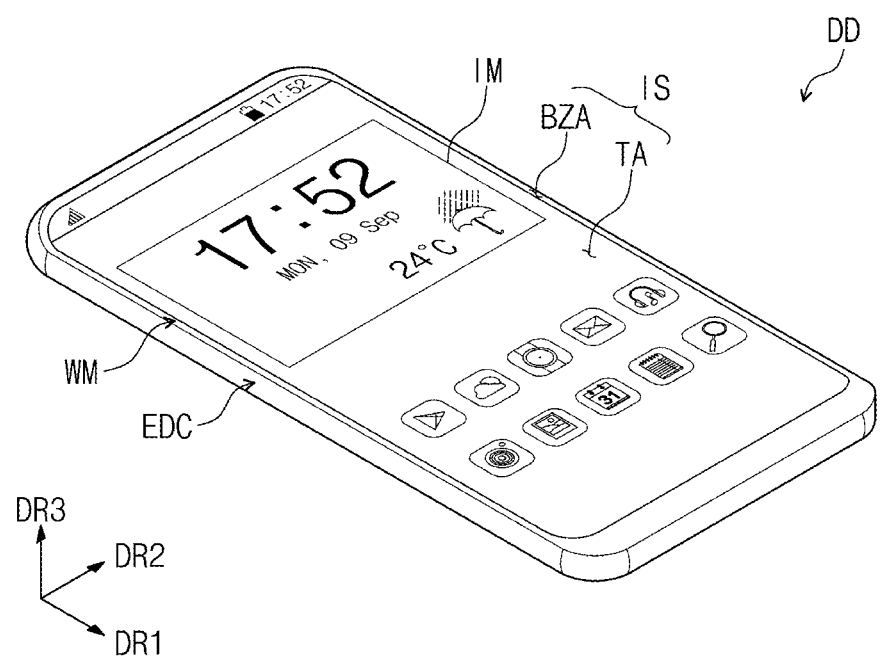
FIG. 1A is a perspective view of a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
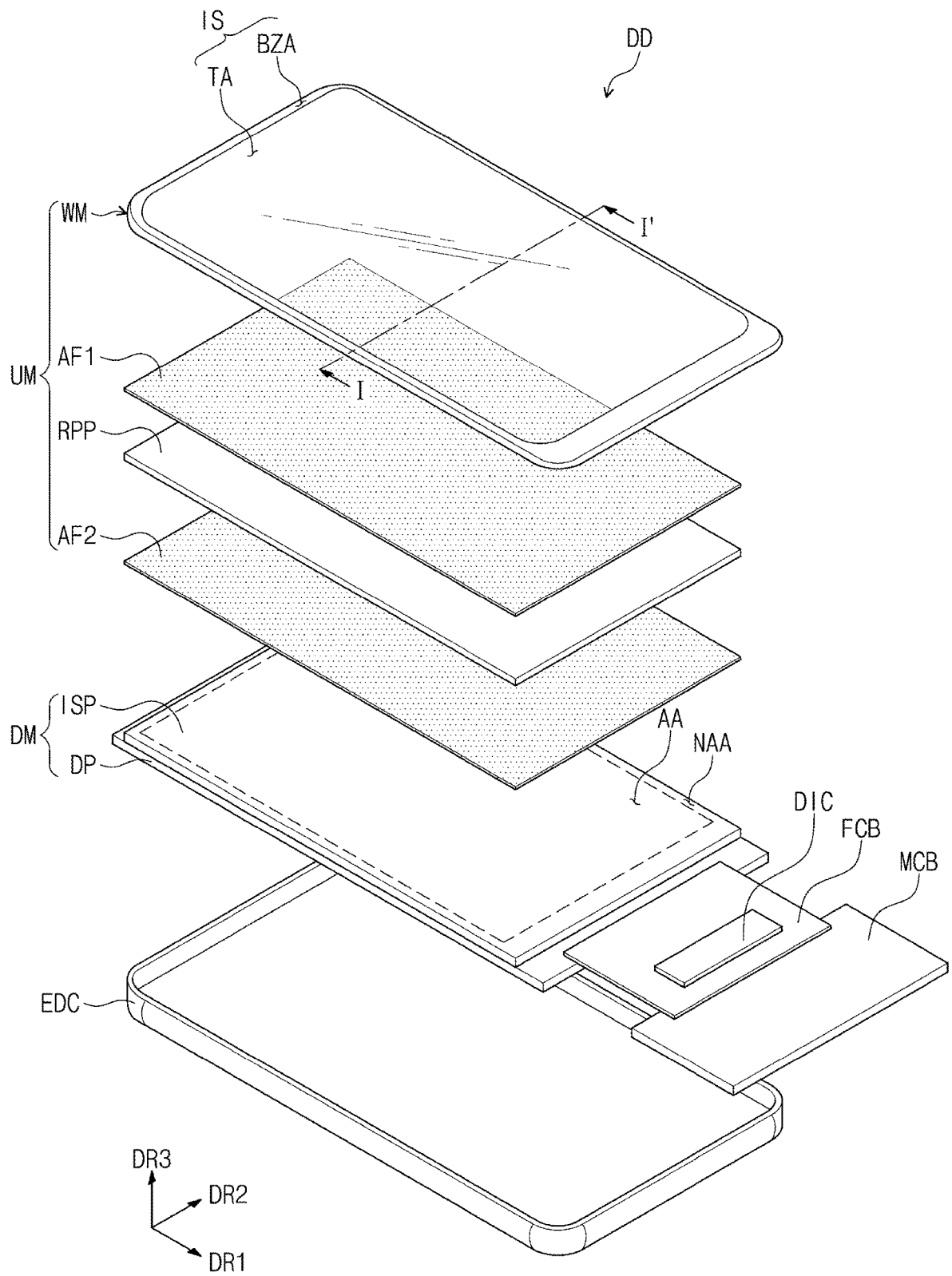
FIG. 1B is an exploded perspective view of a display device according to an embodiment.
Figure 2A:
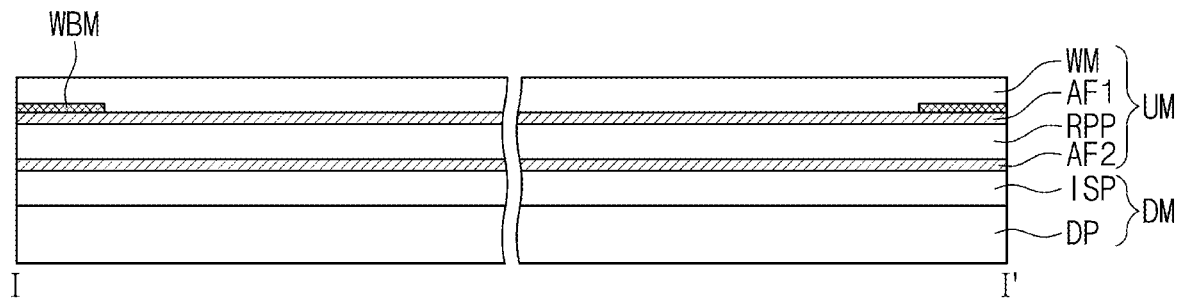
FIG. 2A is a cross-sectional view taken along line I-I' of a display device shown in FIG. 1B.
Figure 2B:
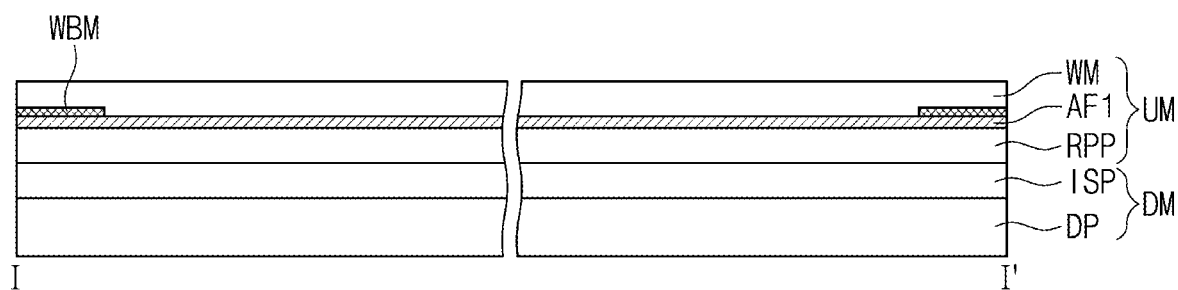
FIG. 2B and FIG. 2C are sectional views of a display device according to an embodiment.
Figure 2C:
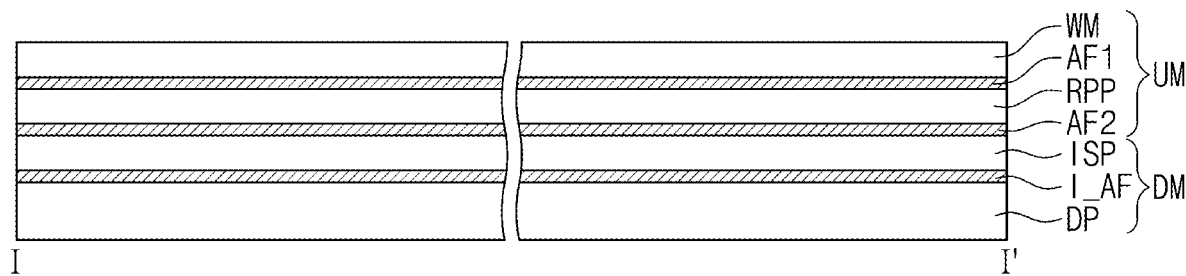

FIG. 1A is a perspective view of a display device according to an embodiment, and FIG. 1B is an exploded perspective view of a display device according to an embodiment. FIG. 2A is a cross-sectional view taken along the cutting line I-I' shown in FIG. 1B, FIG. 2B and FIG. 2C are cross-sectional views of a display device according to an embodiment.

Referring to FIGS. 1A and 2A, a display device DD may be a device activated according to an electrical signal. The display device DD may be employed in various electronic devices, such as smart watches, tablets, laptops, computers, and smart televisions.

The display device DD may display the image IM toward a third direction DR3 on a display surface IS parallel to a first direction DR1 and a second direction DR2. The display surface IS on which the image IM is displayed may correspond to the front surface of the display device DD. The Image IM may include still images as well as dynamic images.

As used herein, the front surface (or upper surface) and the rear surface (or lower surface) of each member are defined with reference to the direction in which the image IM is displayed. The front surface and the rear surface are opposed to each other in the third direction DR3, and the normal direction of each of the front surface and the rear surface may be parallel to the third direction DR3.

The separation distance between the front surface and the rear surface in the third direction DR3 may correspond to the thickness along the third direction DR3 of the display device DD. However, the directions indicated by the first to third directions DR1, DR2, and DR3 are relative concept, and may be converted to other directions in other embodiments.

The display device DD may detect an external input applied from the outside. The external input may include various types of inputs provided from outside the display device DD. For example, the external input may include an input (e.g., hovering) that is applied when a portion of the body, such as the user's hand, is close to or is spaced apart at a predetermined distance from the display device DD, as well as a contact thereby. In addition, the external input may have various forms such as force, pressure, temperature, and light.

The front surface of the display device DD may be divided into a transmission area TA and a bezel area BZA. The transmission area TA may be an area where the image IM is displayed. The user views the image IM through the transmission area TA. In the illustrated embodiment, the transmissive area TA is shown as having a rectangular shape with rounded vertices. However, the inventive concepts are not limited thereto, and the transmission area TA may have various shapes in other embodiments.

The bezel area BZA is adjacent to the transmission area TA. The bezel area BZA may have a predetermined color. The bezel area BZA may surround the transmission area TA. Accordingly, the shape of the transmission area TA may be substantially defined by the bezel area BZA. However, in some embodiments, the bezel area BZA may be disposed adjacent to only one side of the transmission area TA, or may be omitted.

As shown in FIGS. 1B and 2A, the display device DD may include a display module DM and an upper module UM disposed on the display module DM. The display module DM may include a display panel DP and an input detection layer ISP. The upper module UM may include a window WM and an anti-reflection layer RPP.

The display panel DP according to an embodiment may be a light emitting display panel, without being limited thereto. For example, the display panel DP may be an organic light emitting display panel or a quantum dot light emitting display panel. The light emitting layer of the organic light emitting display panel may include an organic light emitting material. The light emitting layer of the quantum dot light emitting display panel may include quantum dot, quantum rod, and the like. Hereinafter, the display panel DP will exemplarily be described as an organic light emitting display panel.

According to FIG. 2A, the input detection layer ISP may be directly disposed on the display panel DP. According to an embodiment, the input detection layer ISP may be formed on the display panel DP by a continuous process. More particularly, when the input detection layer ISP is disposed directly on the display panel DP, the adhesive film is not disposed between the input detection layer ISP and the display panel DP. However, according to another embodiment, an internal adhesive film I_AF may be disposed between the input detection layer ISP and the display panel DP as shown in FIG. 2C. In this case, the input detection layer ISP may not be manufactured by a continuous process with the display panel DP, and may be manufactured through a separate process from the display panel DP, and then may be fixed to the upper surface of the display panel DP by the internal adhesive film I_AF.

The display panel DP generates an image IM, and the input detection layer ISP obtains coordinate information of an external input (e.g., a touch event).

The window WM may be made of a transparent material capable of transmitting an image IM. For example, the window WM may include glass, sapphire, plastic, and the like. The window WM is exemplarily illustrated as a single layer, but in some embodiments, the window WM may include a plurality of layers. The bezel area BZA of the above-described display device DD may be provided as an area in which a material including a predetermined color is printed on one area of the window WM. For example, the window WM may include a light blocking pattern WBM for defining the bezel area BZA. The light blocking pattern WBM may be formed as a colored organic film, for example, by a coating method.

The anti-reflection layer RPP reduces the reflectance of external light incident from the upper side of the window WM. An anti-reflection layer RPP according to an embodiment may include a retarder and a polarizer. The retarder may be a film type or a liquid crystal coating type, and may include a $\lambda/2$ retarder and/or a $\lambda/4$ retarder. The polarizer may also be of a film type or a liquid crystal coating type. The film type includes a stretch-type synthetic resin film, and the liquid crystal coating type may include liquid crystals arranged in a predetermined arrangement. The retarder and polarizer may be implemented as one polarizing film. The anti-reflection layer RPP may further include a protective film disposed above or below the polarizing film.

The anti-reflection layer RPP may be disposed on the input detection layer ISP. In particular, the anti-reflection layer RPP may be disposed between the input detection layer ISP and the window WM. The anti-reflection layer RPP and the window WM may be coupled to each other through the first adhesive film AF1. The anti-reflection layer RPP may be combined with an input detection layer ISP through a second adhesive film AF2.

Each of the first and second adhesive films AF1 and AF2 according to an embodiment may include an optically clear adhesive film (OCA). However, in some embodiments, each of the first and second adhesive films AF1 and AF2 may include a conventional adhesive or gluing agent. For example, each of the first and second adhesive films AF1 and AF2 may include an optically clear resin (OCR) or a pressure sensitive adhesive film (PSA).

FIG. 2A exemplarily shows that the anti-reflection layer RPP is fixed to the input detection layer ISP by the second adhesive film AF2, but the inventive concepts are not limited thereto. For example, as shown in FIG. 2B, the anti-reflection layer RPP may be formed on the input detection layer ISP by a continuous process. In this case, the anti-reflection layer RPP may not include a polarizing film, and may include color filters disposed directly on the input detection layer ISP.

The display module DM displays an image IM according to an electrical signal and transmits/receives information on an external input. The display module DM may be defined by an active area AA and a peripheral area NAA. The active area AA may be defined as an area for emitting an image IM provided by the display module DM.

The peripheral area NAA is adjacent to the active area AA. For example, the peripheral area NAA may surround the active area AA. However, the inventive concepts are not limited thereto, and the peripheral area NAA may be defined in various shapes in other embodiments. According to an embodiment, the active area AA of the display module DM may correspond to at least a part of the transmission area TA.

The display module DM may further include a main circuit board MCB, a flexible circuit film FCB, and a driving chip DIC.

The main circuit board MCB may be electrically connected to the display panel DP through the flexible circuit film FCB. The main circuit board MCB may include a plurality of driving elements. The plurality of driving elements may include a circuit unit for driving the display panel DP.

The flexible circuit film FCB is connected to the display panel DP to electrically connect the display panel DP and the main circuit board MCB. A driving chip DIC may be mounted on the flexible circuit film FCB.

The driving chip DIC may include driving elements for driving a pixel of the display panel DP, for example, a data driving circuit. FIG. 1B exemplarily illustrate a single flexible circuit film FCB connected to the display panel DP, however, in some embodiments, a plurality of the flexible circuit film FCB may be connected to the display panel DP.

FIG. 1B exemplarily illustrates a structure in which the driving chip DIC is mounted on the flexible circuit film FCB, but the inventive concepts are not limited thereto. For example, the driving chip DIC according to another embodiment may be directly mounted on the display panel DP. In this case, a portion on which the driving chip DIC of the display panel DP is mounted may be bent to be disposed on the rear surface of the display module DM.

The input detection layer ISP may be electrically connected to the main circuit board MCB through the flexible circuit film FCB. However, the inventive concepts are not limited thereto. For example, in some embodiments, the display module DM may additionally include a separate flexible circuit film for electrically connecting the input detection layer ISP to the main circuit board MCB.

The display device DD further includes an outer case EDC accommodating the display module DM. The outer case EDC may be combined with the window WM to define the appearance of the display device DD. The outer case EDC absorbs the shock applied from the outside and prevents foreign substances/moisture, etc. that may penetrate into the display module DM, thereby protecting the components accommodated in the outer case EDC. In some embodiments, the outer case EDC may be combined with a plurality of storage members.

The display device DD according to an embodiment may include an electronic module including various functional modules for operating the display module DM, a power supply module for supplying power required for the overall operation of the display device DD, and a bracket that is combined with the display module DM and/or the outer case EDC to divide the interior space of the display device DD, and the like.

Figure 3:
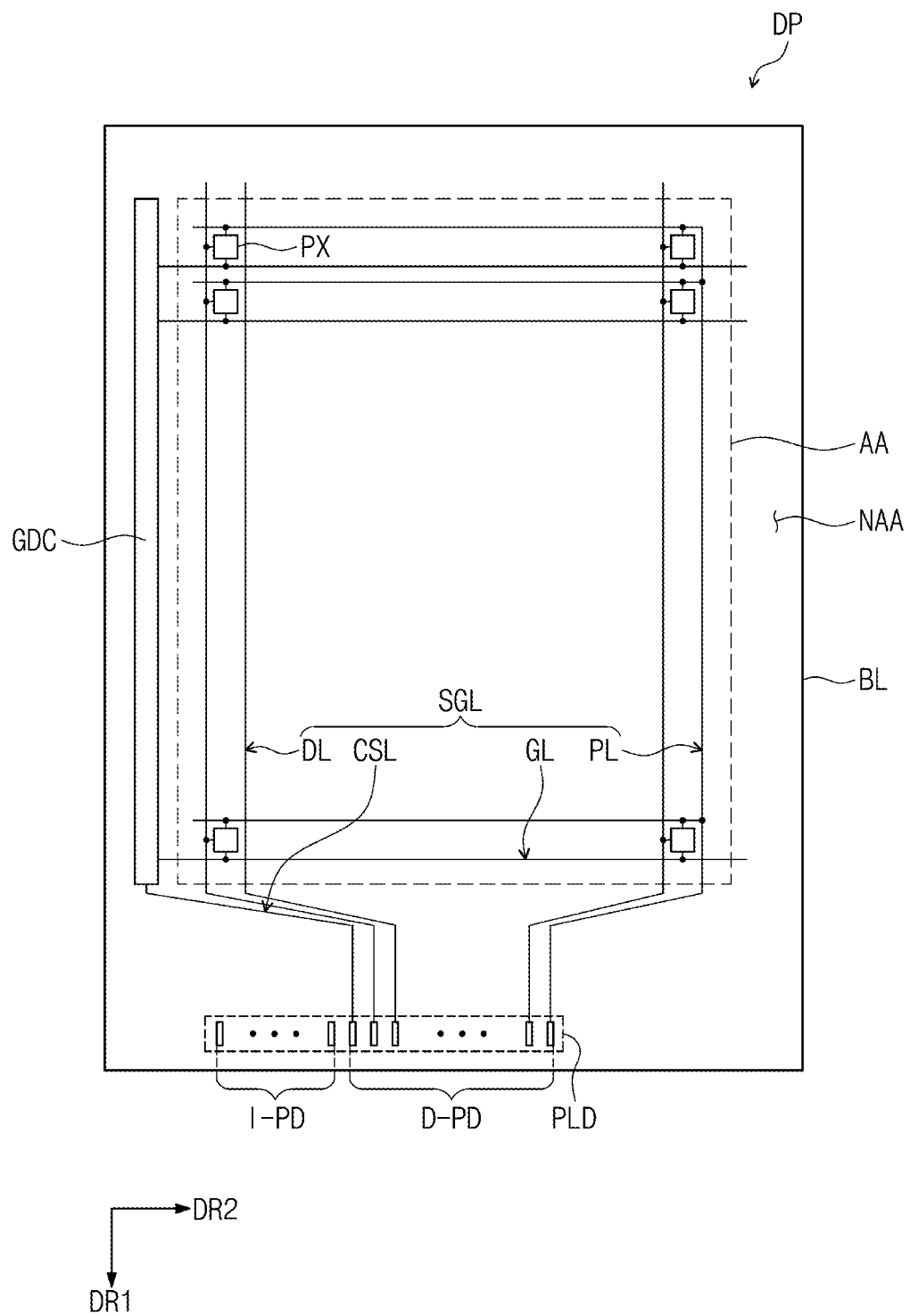
FIG. 3 is a plan view of a display panel according to an embodiment.
Figure 4:
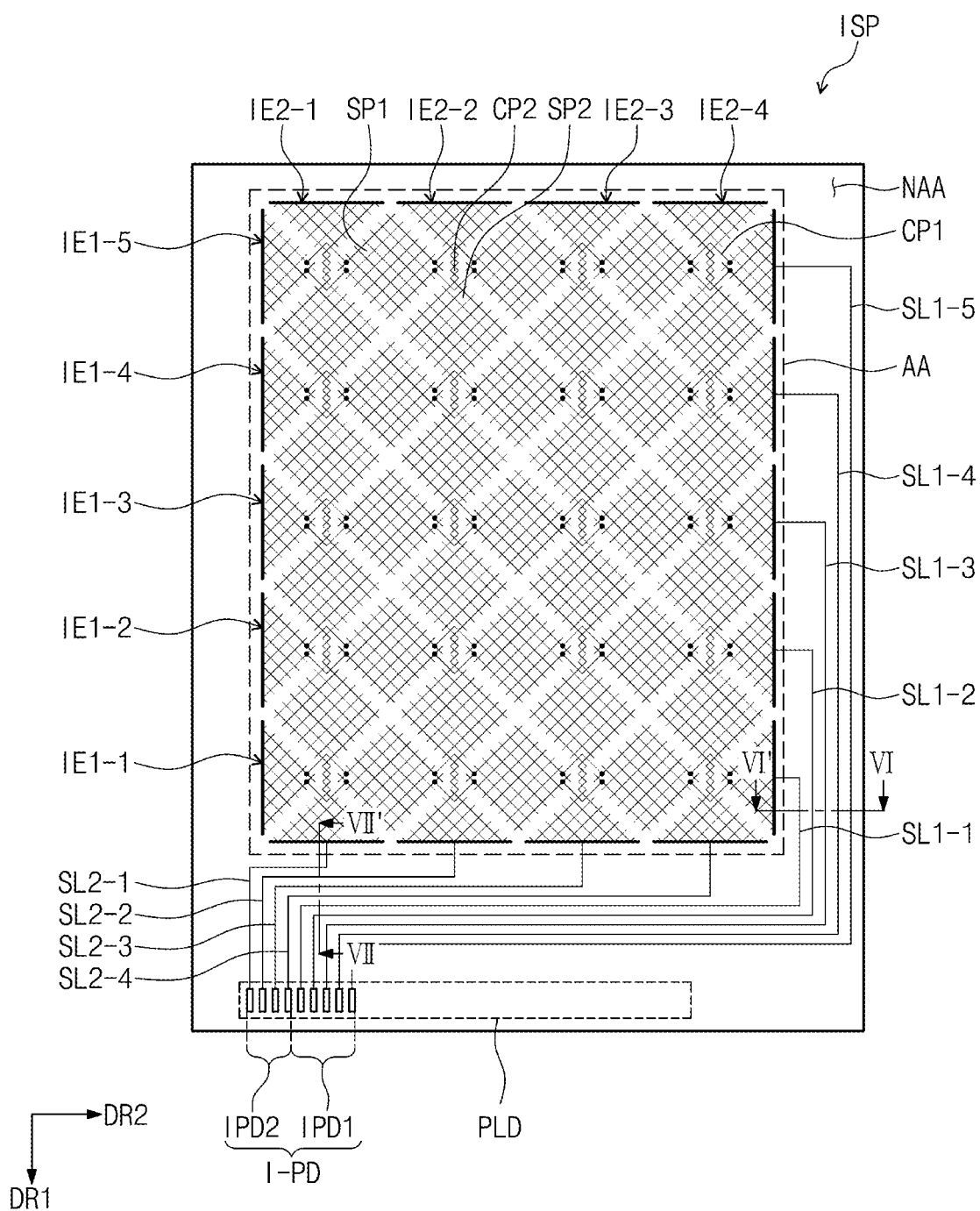
FIG. 4 is a plan view of an input detection layer according to an embodiment.

FIG. 3 is a plan view of a display panel according to an embodiment, and FIG. 4 is a plan view of an input detection layer according to an embodiment.

Referring to FIGS. 3 and 4, the display panel DP may include a driving circuit GDC, a plurality of signal lines SGL, and a plurality of pixels PX. The display panel DP may further include a pad part PLD disposed in the peripheral area NAA. The pad part PLD includes pixel pads D-PD connected to a corresponding signal line among the plurality of signal lines SGL.

The pixels PX are disposed in the active area AA. Each of the pixels PX includes an organic light emitting diode and a pixel driving circuit connected thereto. The driving circuit GDC, the signal lines SGL, the pad part PLD, and the pixel driving circuit may be included in the circuit element layer DP-CL shown in FIGS. 13A and 13B.

The driving circuit GDC may include a gate driving circuit. The gate driving circuit generates a plurality of gate signals and sequentially outputs the gate signals to a plurality of gate lines GL, which will be described in more detail later. The gate driving circuit may further output another control signal to the pixel driving circuit.

The signal lines SGL include gate lines GL, data lines DL, power lines PL, and a control signal line CSL. One of the gate lines GL is connected to a corresponding pixel PX among the pixels PX, and one of the data lines DL is connected to a corresponding pixel PX among the pixels PX. The power line PL is connected to the pixels PX. The control signal line CSL may provide control signals to the driving circuit GDC. The signal lines SGL overlap the active area AA and the peripheral area NAA.

The pad part PLD is a part to which a flexible circuit film FCB shown in FIG. 1B is connected, and may include pixel pads D-PD for connecting the flexible circuit film FCB to the display panel DP and input pads I-PD for connecting the flexible circuit film FCB to the input detection layer ISP. The pixel pads D-PD and the input pads I-PD may be provided as parts which are extended from wirings disposed in the circuit element layer DP-CL, and are exposed from the insulating layer included in the circuit element layer DP-CL.

The pixel pads D-PD are connected to corresponding pixels PX through signal lines SGL. Also, the driving circuit GDC may be connected to any one of the pixel pads D-PD.

Referring to FIG. 4, the input detection layer ISP according to an embodiment may include reception sensing electrodes IE1-1 to IE1-5, one side reception trace lines SL1-1 to SL1-5 connected to the reception sensing electrodes IE1-1 to IE1-5, transmission sensing electrodes IE2-1 to IE2-4, and one side transmission trace lines SL2-1 to SL2-4 connected to the transmission sensing electrodes IE2-1 to IE2-4.

The reception sensing electrodes IE1-1 to IE1-5 and the transmission sensing electrodes IE2-1 to IE2-4 intersect each other. The reception sensing electrodes IE1-1 to IE1-5 are arranged in the first direction DR1, each extending in the second direction DR2. The transmission sensing electrodes IE2-1 to IE2-4 are arranged in the second direction DR2, each extending in the first direction DR1.

A capacitance is formed between the reception sensing electrodes IE1-1 to IE1-5 and the transmission sensing electrodes IE2-1 to IE2-4. The capacitance between the reception sensing electrodes IE1-1 to IE1-5 and the transmission sensing electrodes IE2-1 to IE2-4 may be changed by an external input (e.g., a touch event). The sensing sensitivity of the input detection layer ISP may be determined according to the amount of change in the capacitance. More particularly, as the amount of change in the capacitance is larger due to external input, the sensing sensitivity of the input detection layer ISP may become higher.

Each of the reception sensing electrodes IE1-1 to IE1-5 includes first sensor parts SP1 and first connection parts CP1 which are disposed in the active area AA. Each of the transmission sensing electrodes IE2-1 to IE2-4 includes second sensor parts SP2 and second connection parts CP2 which are disposed in the active area AA. The two first sensor parts SP1 disposed at both ends of the reception sensing electrodes IE1-1 to IE1-5 may have a small size, for example, a half size, compared to the first sensor part SP1 disposed at the center. The two second sensor parts SP2 disposed at both ends of the transmission sensing electrodes IE2-1 to IE2-4 may have a small size, for example, a half size, compared to the second sensor part SP2 disposed at the center.

FIG. 4 illustrates the reception sensing electrodes IE1-1 to IE1-5 and the transmission sensing electrodes IE2-1 to IE2-4 according to an embodiment, but the shape thereof is not limited thereto. For example, in another embodiment, the reception sensing electrodes IE1-1 to IE1-5 and the transmission sensing electrodes IE2-1 to IE2-4 may have a shape (e.g., bar shape) without distinction between sensor parts SP1 and SP2 and connection parts CP1 and CP2. The first sensor parts SP1 and the second sensor parts SP2 are exemplarily illustrated as having a rhombic shape, but the inventive concepts are not limited thereto, and the first sensor parts SP1 and second sensor parts SP2 may have different polygonal shapes in other embodiments.

In one reception sensing electrode, the first sensor parts SP1 are arranged along the second direction DR2, and in one transmission sensing electrode, the second sensor parts SP2 are arranged along the first direction DR1. Each of the first connection parts CP1 connects two first sensor parts SP1 adjacent to each other, and each of the second connection parts CP2 connects two second sensor parts SP2 adjacent to each other.

The reception sensing electrodes IE1-1 to IE1-5 and the transmission sensing electrodes IE2-1 to IE2-4 may have a mesh shape. As the reception sensing electrodes IE1-1 to IE1-5 and transmission sensing electrodes IE2-1 to IE2-4 have a mesh shape, parasitic capacitance with the electrodes of the display panel DP (see FIG. 3) may be reduced.

The mesh-shaped reception sensing electrodes IE1-1 to IE1-5 and the mesh-shaped transmission sensing electrodes IE2-1 to IE2-4 may include silver, aluminum, copper, chromium, nickel, titanium, and the like, which can be formed through low-temperature processes, without being limited to. In this manner, even when an input detection layer ISP is formed by a continuous process, damage to the organic light emitting diodes can be prevented.

The one side reception trace lines SL1-1 to SL1-5 are respectively connected to one ends of the reception sensing electrodes IE1-1 to IE1-5, respectively. In some embodiments, the input detection layer ISP may further include other side reception trace lines connected to the other ends of the reception sensing electrodes IE1-1 to IE1-5. The one side transmission trace lines SL2-1 to SL2-4 are respectively connected to one ends of the transmission sensing electrodes IE2-1 to IE2-4. In some embodiments, the input detection layer ISP may further include other side transmission trace lines connected to the other ends of the transmission sensing electrodes IE2-1 to IE2-4.

The other side reception trace lines have substantially the same configuration as the one side reception trace lines SL1-1 to SL1-5, and the other side transmission trace lines may have substantially the same configuration as the one side transmission trace lines SL2-1 to SL2-4. As such, hereinafter, only the one side reception trace lines SL1-1 to SL1-5 and the one side transmission trace lines SL2-1 to SL2-4 will be described, and repeated descriptions for the other side reception trace lines and the other side transmission trace lines will be omitted. In addition, for convenience of description, the one side reception trace lines SL1-1 to SL1-5 will be referred to as reception trace lines SL1-1 to SL1-5, and the one side transmission trace lines SL2-1 to SL2-4 will be referred to as transmission trace lines SL2-1 to SL2-4.

The reception trace lines SL1-1 to SL1-5 and the transmission trace lines SL2-1 to SL2-4 may be disposed in the peripheral area NAA. The input detection layer ISP may include the input pads I-PD disposed in the peripheral area NAA and extended from one ends of the reception trace lines SL1-1 to SL1-5 and the transmission trace lines SL2-1 to SL2-4. The input pads I-PD include first input pads IPD1 connected to the reception trace lines SL1-1 to SL1-5, and second input pads IPD2 connected to the transmission trace lines SL2-1 to SL2-4.

Figure 5:
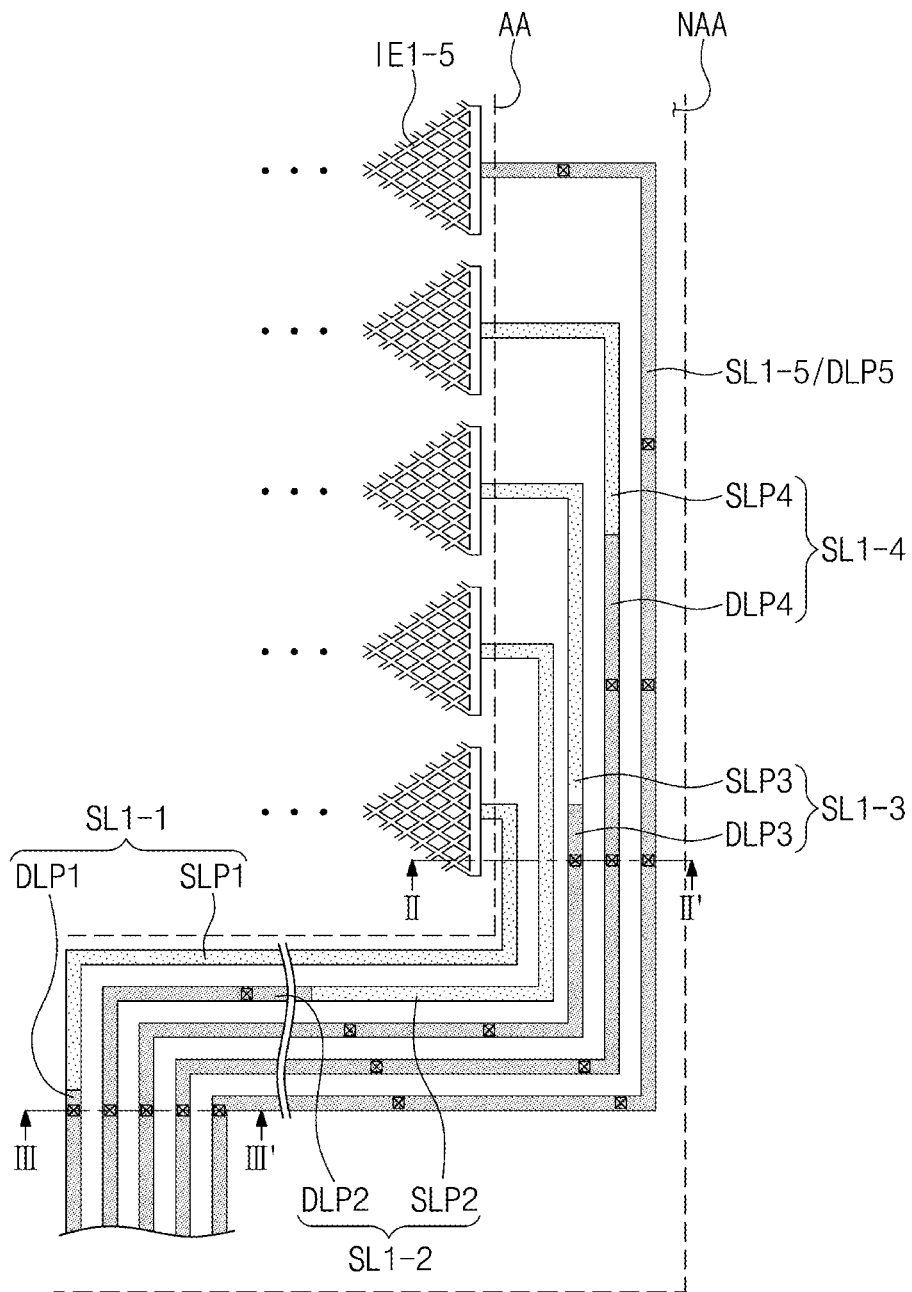
FIG. 5 is an enlarged plan view showing enlarged reception trace lines shown in FIG. 4.
Figure 6A:
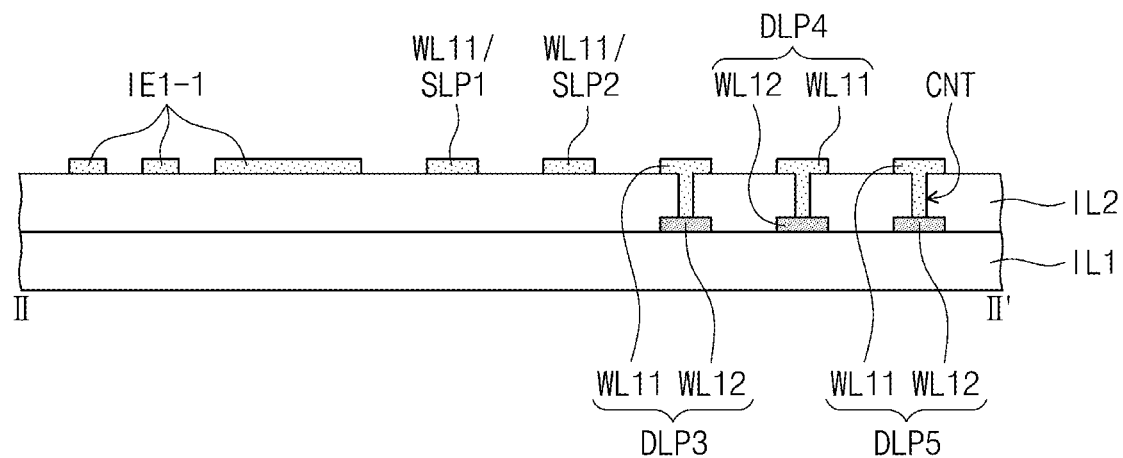
FIG. 6A is a cross-sectional view taken along line II-II' shown in FIG. 5.
Figure 6B:
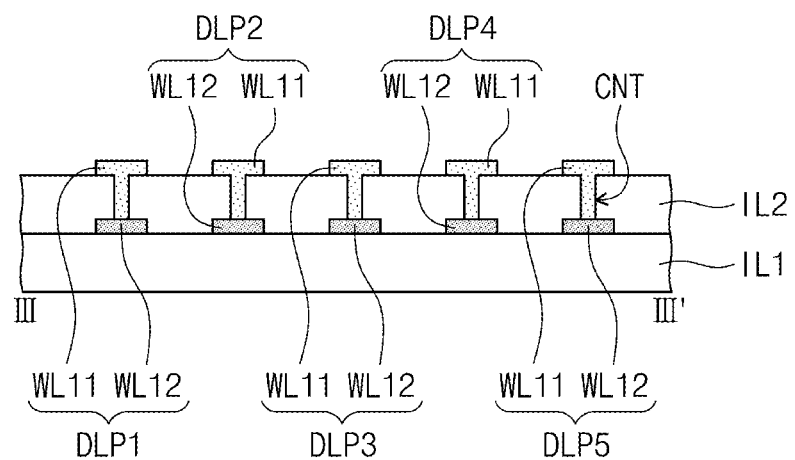
FIG. 6B is a cross-sectional view taken along line III-III' shown in FIG. 5.

FIG. 5 is an enlarged plan view of reception trace lines shown in FIG. 4, FIG. 6A is a cross-sectional view taken along line II-IF shown in FIG. 5, and FIG. 6B is a cross-sectional view taken along line III-III' shown in FIG. 5.

Referring to FIGS. 4 and 5, the reception sensing electrodes IE1-1 to IE1-5 include the first reception sensing electrodes IE1-1 to the fifth reception sensing electrodes IE1-5, and the reception trace lines SL1-1 to SL1-5 include first reception trace lines SL1-1 to fifth reception trace lines SL1-5.

The first reception sensing electrodes IE1-1 to the fifth reception sensing electrodes IE1-5 may be sequentially arranged in a direction away from the input pads I-PD. More particularly, the first reception sensing electrode IE1-1 among the reception sensing electrodes IE1-1 to IE1-5 may be disposed closest to the input pads I-PD, and the fifth reception sensing electrode IE1-5 among the reception sensing electrodes IE1-1 to IE1-5 may be disposed farthest from the input pads I-PD.

The reception trace lines SL1-1 to SL1-5 electrically connect the first input pads IPD1 and the reception sensing electrodes IE1-1 to IE1-5. The reception trace lines SL1-1 to SL1-5 have different lengths from each other. For example, the first reception trace line SL1-1 among the reception trace lines SL1-1 to SL1-5 may have the shortest length, and the fifth reception trace line SL1-5 among the reception trace lines SL1-1 to SL1-5 may have the longest length.

At least some of the reception trace lines SL1-1 to SL1-5 may include a single layer part and a multilayer part. For example, each of the first to fourth reception trace lines SL1-1 to SL1-4 among the reception trace lines SL1-1 to SL1-5 includes the single layer part and the multilayer part, and the fifth reception trace line SL1-5 may include only the multilayer part. As another example, at least one of the reception trace lines SL1-1 to SL1-5 may include only the single layer part. For example, the first reception trace line SL1-1 of the reception trace lines SL1-1 to SL1-5 may include only the single layer part, each of the second to fourth reception trace lines SL1-2 to SL1-4 may include the single layer part and the multilayer part, and the fifth reception trace line SL1-5 may include only the multilayer part.

As shown in FIG. 5, the first reception trace line SL1-1 includes a first single layer part SLP1 and a first multilayer part DLP1, the second reception trace line SL1-2 includes a second single layer part SLP2 and a second multilayer part DLP2, and the third reception trace line SL1-3 includes a third single layer part SLP3 and a third multilayer part DLP3. The fourth reception trace line SL1-4 includes a fourth single layer part SLP4 and a fourth multilayer part DLP4, and the fifth reception trace line SL1-5 includes a fifth multilayer part DLP5.

The lengths of the first to fourth single layer parts SLP1 to SLP4 may be different from each other. More particularly, the length of each of the first to fourth single layer parts SLP1 to SLP4 may decrease in proportion to the length of a corresponding reception trace line. For example, the length of the first reception trace line SL1-1 is different from that of the second reception trace line SL1-2. In this case, the length ratio of the first single layer part SLP1 and the first multilayer part DLP1 in the first reception trace line SL1-1 may be different from the length ratio of the second single layer part SLP2 and the second multilayer part DLP2 in the second reception trace line SL1-2. More particularly, if the length of the second reception trace line SL1-2 is greater than the length of the first reception trace line SL1-1, the ratio occupied by the first single layer part SLP1 in the entire length of the first reception trace line SL1-1 may be greater than the ratio occupied by the second single layer part SLP2 in the entire length of the second reception trace line SL1-2. For example, the length ratio of the first single layer part SLP1 to the first multilayer part DLP1 in the first reception trace line SL1-1 may be 8:2, and the length ratio of the second single layer part SLP2 and the second multilayer part DLP2 in the second reception trace line SL1-2 may be 6:4. The length ratio of the single layer part and the multilayer part in each reception trace line is not particularly limited, and by adjusting the length ratio of single layer part and multilayer part in each reception trace line, the line resistance values of all reception trace lines can be set to be at the same level. In addition, the length ratio of the single layer part and the multilayer part in each reception trace line may be set differently according to the number of reception trace lines SL1-1 to SL1-5, the size of the input detection layer ISP, and the like.

The length ratio of the single layer part in each of the reception trace lines SL1-1 to SL1-5 may be reduced as being disposed further away from the input pads I-PD and the length of a corresponding reception trace line becomes greater. For example, the longest fifth reception trace line SL1-5 among the reception trace lines SL1-1 to SL1-5 may not include a single layer part.

Referring to FIGS. 5, 6A and 6B, each of the first to fourth single layer parts SLP1 to SLP4 includes a first wiring layer WL11, and each of the first to fifth multilayer parts DLP1 to DLP5 includes a first wiring layer WL11 and a second wiring layer WL12.

For example, the input detection layer ISP further includes first and second insulating layers IL1 and IL2. The second wiring layer WL12 is disposed on the first insulating layer IL1, and the second wiring layer WL12 is covered by the second insulating layer IL2. The first wiring layer WL11 is disposed on the second insulating layer IL2. The reception sensing electrodes IE1-1 to IE1-5 may be disposed on the second insulating layer IL2. In particular, the first to fourth single layer parts SLP1 to SLP4 and the reception sensing electrodes IE1-1 to IE1-5 may be disposed on the same layer. When the first to fourth single layer parts SLP1 to SLP4 and the reception sensing electrodes IE1-1 to IE1-5 are disposed on the same layer, the first to fourth reception sensing electrodes IE1-1 to IE1-4 may be integrally formed with the first to fourth single layer parts SLP1 to SLP4, respectively.

In each of the first to fifth multilayer parts DLP1 to DLP5, the first and second wiring layers WL11 and WL12 may be electrically connected to each other. Each of the first to fifth multilayer parts DLP1 to DLP5 may be provided with at least one contact hole CNT. The first and second wiring layers WL11 and WL12 may be electrically connected to each other through the contact hole CNT.

FIG. 6A exemplarily illustrates a structure in which each of the first to fourth single layer parts SLP1 to SLP4 includes the first wiring layer WL11, but the inventive concepts are not limited thereto. In some embodiments, each of the first to fourth single layer parts SLP1 to SLP4 may include a second wiring layer WL12. In this case, the first to fourth single layer parts SLP1 to SLP4 may be disposed on a different layer from the reception sensing electrodes IE1-1 to IE1-5.

As shown in FIGS. 6A and 6B, each of the first to fourth single layer parts SLP1 to SLP4 includes one wiring layer (e.g., the first wiring layer WL11), and each of the first to fifth multilayer parts DLP1 to DLP5 includes at least two wiring layers (e.g., the first and the second wiring layers WL11 and WL12). As such, based on the same length of each of the reception trace lines SL1-1 to SL1-4, the line resistance value of the single layer part may be greater than that of the multilayer part. When the length of the single layer part of the relatively short reception trace line is formed longer than the length of the single layer part of the relatively long reception trace line, the difference in line resistance of two reception trace lines of different lengths can be compensated.

As such, even when each of the reception trace lines SL1-1 to SL1-5 has a different length, each of the reception trace lines SL1-1 to SL1-5 may be formed to have substantially the same level of line resistance (i.e., constant resistance design) by adjusting the length ratio of the single layer part of each of the reception trace lines SL1-1 to SL1-4. In this manner, it is possible to prevent a decrease in sensing accuracy of the input detection layer ISP due to a difference in length of each of the reception trace lines SL1-1 to SL1-5.

In addition, in designing the constant resistance, since the width or length of each of the reception trace lines SL1-1 to SL1-5 may not be adjusted, it is possible to prevent an increase in the width (i.e., bezel width) of the peripheral area NAA in the display module DM (shown in FIG. 1B).

Figure 7:
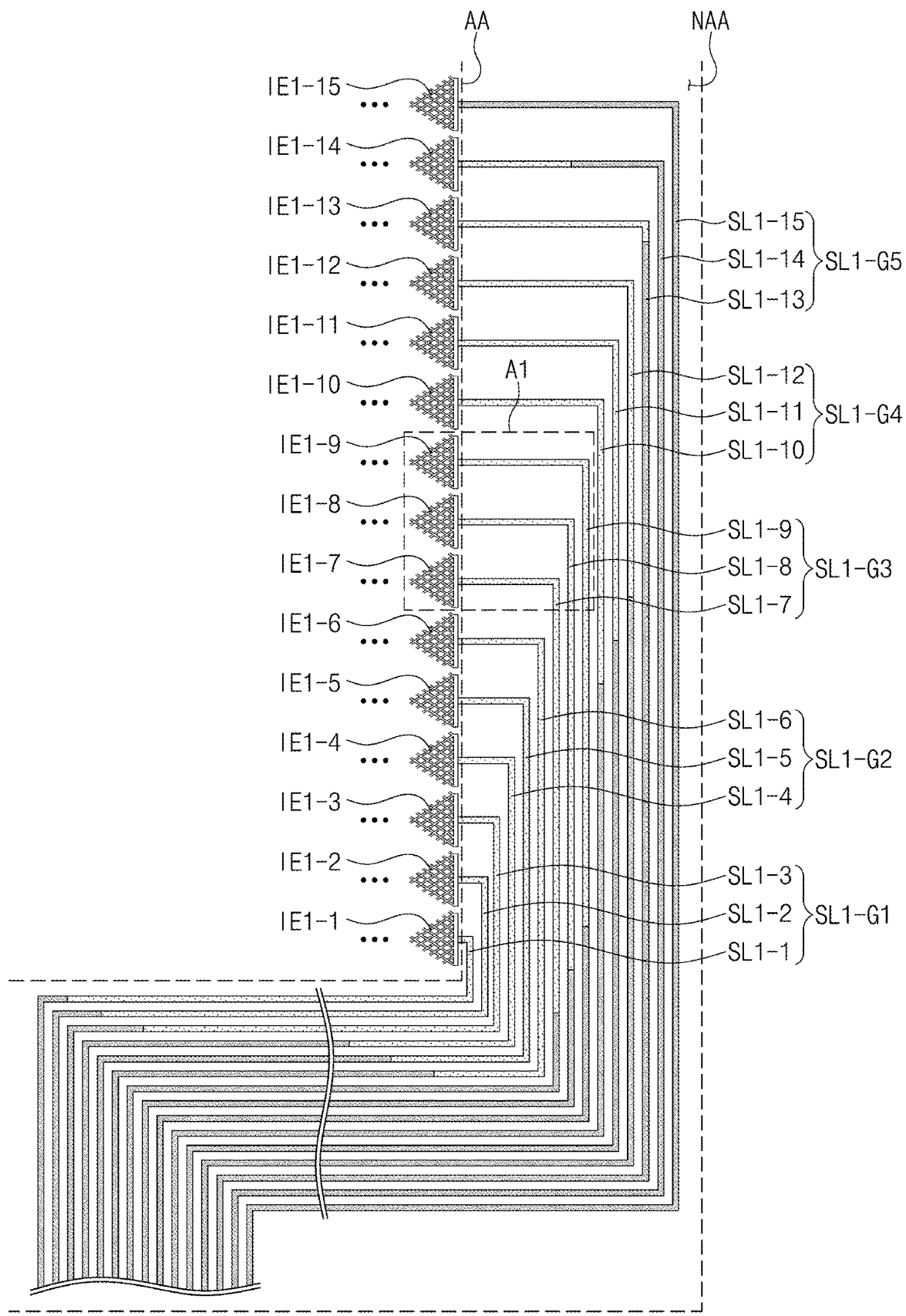
FIG. 7 is a plan view showing reception trace lines according to an embodiment.
Figure 8:
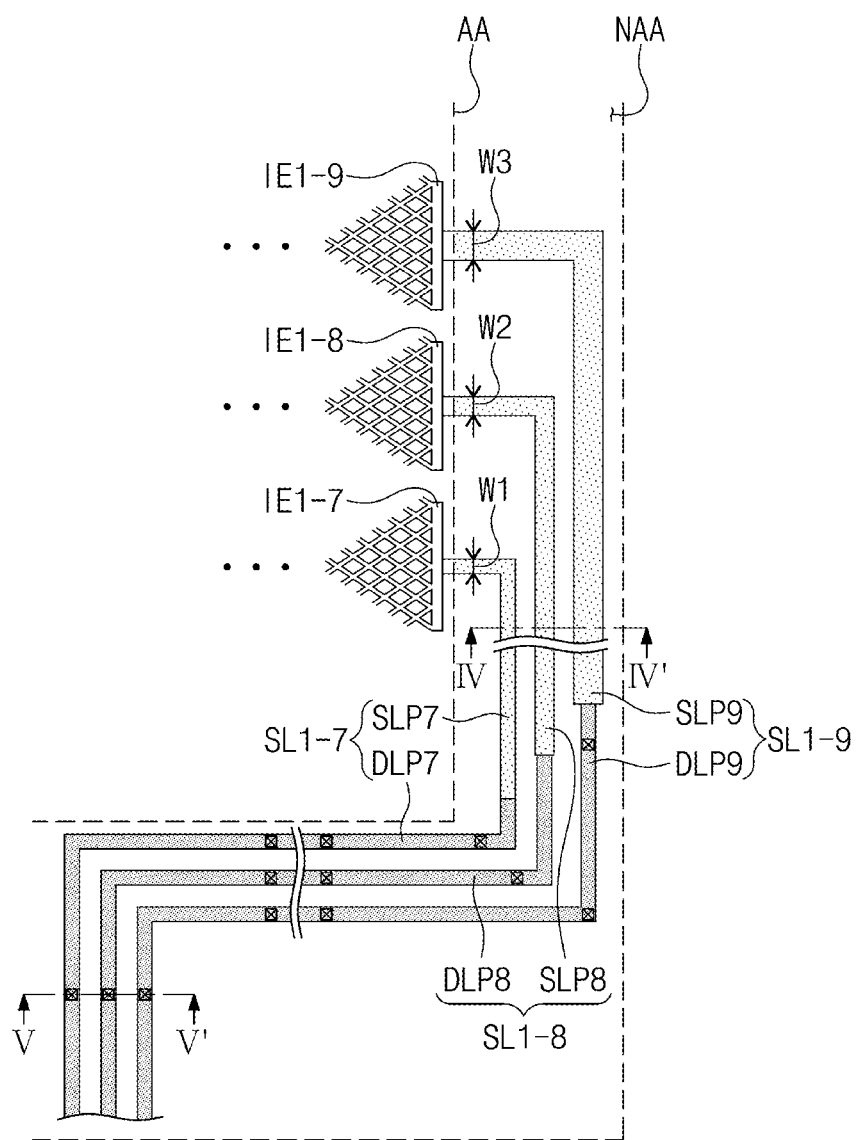
FIG. 8 is an enlarged plan view of a portion A1 shown in FIG. 7 according to an embodiment.
Figure 9A:
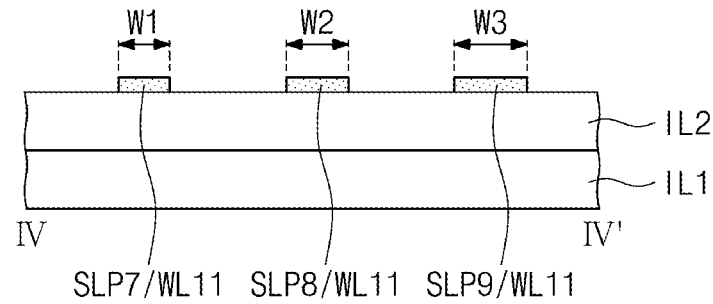
FIG. 9A is a cross-sectional view taken along line IV-IV' shown in FIG. 8.
Figure 9B:
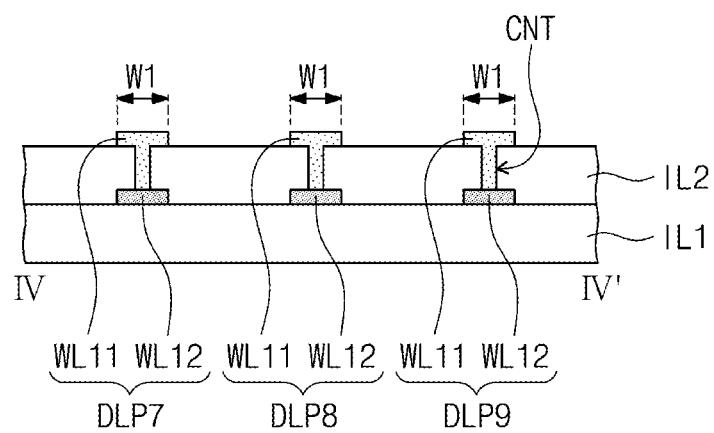
FIG. 9B is a cross-sectional view taken along line V-V' shown in FIG. 8.

FIG. 7 is a plan view showing reception trace lines according to an embodiment, and FIG. 8 is an enlarged plan view of portion A1 shown in FIG. 7. FIG. 9A is a cross-sectional view taken along line IV-IV' shown in FIG. 8, and FIG. 9B is a cross-sectional view taken along line V-V' shown in FIG. 8.

Referring to FIGS. 7 and 8, the reception sensing electrodes IE1-1 to IE1-15 include first reception sensing electrodes IE1-1 to fifteenth reception sensing electrodes IE1-15, and the reception trace lines SL1-1 to SL1-15 include first reception trace lines SL1-1 to fifteenth reception trace lines SL1-15.

The first reception sensing electrodes IE1-1 to the fifteenth reception sensing electrodes IE1-15 may be sequentially arranged in a direction away from the input pads I-PD (shown in FIG. 4). More particularly, the first reception sensing electrode IE1-1 may be disposed closest to the input pads I-PD shown in FIG. 4 among the reception sensing electrodes IE1-1 to IE1-15, and the fifteenth reception sensing electrode IE1-15 may be disposed farthest from the input pads I-PD.

The reception trace lines SL1-1 to SL1-15 electrically connect the first input pads IPD1 shown in FIG. 4 and the reception sensing electrodes IE1-1 to IE1-15. The reception trace lines SL1-1 to SL1-15 have different lengths. For example, the first reception trace line SL1-1 of the reception trace lines SL1-1 to SL1-15 may have the shortest length, and the fifteenth reception trace line SL1-15 may have the longest length.

The reception trace lines SL1-1 to SL1-15 may be grouped into a plurality of groups. For example, the reception trace lines SL1-1 to SL1-15 may be grouped into five groups SL1-G1 to SL1-G5, and each of the groups SL1-G1 to SL1-G5 may include three reception trace lines. However, the inventive concepts are not limited to a particular number of groups or a particular number of reception trace lines included in each group.

At least some of the reception trace lines SL1-1 to SL1-15 may include a single layer part and a multilayer part. For example, each of the reception trace lines SL1-1 to SL1-12 of the first to fourth groups SL1-G1 to SL1-G4 may include a single layer part and a multilayer part, and some of the reception trace lines SL1-13 to SL1-15 of the fifth group SL1-G5 may include a single layer part and a multilayer part. The fifteenth reception trace line SL1-15 may include only a multilayer part. However, the inventive concepts are not limited thereto. For example, in some embodiments, some of the reception trace lines SL1-1 to SL1-3 of the first group SL1-G1 may include only a single layer part.

The total lengths of the reception trace lines SL1-1 to SL1-15 is different from each other. For example, the reception trace line connected to the reception sensing electrode disposed farther from the input pads I-PD may have a greater total length. The ratio of the length of the single layer part to the total length of each of the reception trace lines SL1-1 to SL1-14 may be different for each of the reception trace lines SL1-1 to SL1-14. For example, as the total length of each of the reception trace lines SL1-1 to SL1-14 increases, the length ratio of the single layer part to the total length may decrease.

For example, the ratio of the length of the single layer part to the total length of each of the reception trace lines SL1-1 to SL1-14 may be adjusted in groups. More particularly, the ratio of the length of the single layer part to the total length of each of the reception trace lines SL1-1 to SL1-3 belonging to the same group (e.g., the first group SL1-G1) may be the same. In addition, the ratio of the length of the single layer part to the total length of each of the reception trace lines SL1-1 to SL1-3 belonging to the same group (for example, the first group SL1-G1) may be reduced as the total length thereof increases. When the increase rate of the length ratio of the single layer part in each group is defined as the first increase rate, and when the increase rate of the length ratio of the single layer part increased in groups is defined as the second increase rate, the first increase rate may be the same as or different from the second increase rate.

In addition, the ratio of the length of the single layer part to the total length of each of the reception trace lines SL1-1 to SL1-3 belonging to the first group SL1-G1 may be different from the ratio of the length of the single layer part to the total length of each of the reception trace lines SL1-4 to SL1-6 belonging to the second group SL1-G2. For example, the ratio of the length of the single layer part to the total length of each of the reception trace lines SL1-1 to SL1-3 belonging to the first group SL1-G1 may be greater than the ratio of the length of the single layer part to the total length of each of the reception trace lines SL1-4 to SL1-6 belonging to the second group SL1-G2. In addition, the ratio of the length of the single layer part to the total length of each of the reception trace lines SL1-1 to SL1-3 belonging to the first group SL1-G1 may be reduced as the total length increases, and the ratio of the length of the single layer part to the total length of each of the reception trace lines SL1-4 to SL1-6 belonging to the second group SL1-G2 may be reduced as the total length increases. When the increase rate of the length ratio of the single layer part in the first group SL1-G1 is defined as the third increase rate and the increase rate of the length ratio of the single layer part in the second group SL1-G2 is defined as the fourth increase rate, the third increase rate may be the same as or different from the fourth increase rate.

FIG. 8 shows seventh to ninth reception trace lines SL1-7 to SL1-9 belonging to the third group SL1-G3 among the reception trace lines SL1-1 to SL1-15 of FIG. 7. The reception trace lines belonging to each of the first, second, and fourth groups SL1-G1, SL1-G2, and SL1-G4 may have a structure similar to that of the reception trace lines SL1-7 to SL1-9 of the third group SL1-G3. As such, the reception trace lines of the first to fourth groups SL1-G1 to SL1-G4 will be described with reference to the reception trace lines SL1-7 to SL1-9 of the third group SL1-G3.

As shown in FIGS. 8 to 9B, the seventh reception trace line SL1-7 includes a seventh single layer part SLP7 and a seventh multilayer part DLP7, and the eighth reception trace line SL1-8 includes an eighth single layer part SLP8 and an eighth multilayer part DLP8, and the ninth reception trace line SL1-9 includes a ninth single layer part SLP9 and a ninth multilayer part DLP9. The lengths of the seventh to ninth single layer parts SLP7 to SLP9 may be the same as each other or different from each other. By adjusting the length of each of the seventh to ninth single layer parts SLP7 to SLP9, line resistance values of each of the seventh to ninth reception trace lines SL1-7 to SL1-9 may be equally or uniformly matched.

The widths of the seventh to ninth single layer parts SLP7 to SLP9 may be the same as each other or different from each other. The seventh single layer part SLP7 has a first width W1, the eighth single layer part SLP8 has a second width W2, and the ninth single layer part SLP9 has a third width W3. According to an embodiment, the second width W2 may be greater than the first width W1, and the third width W3 may be greater than the second width W2. FIG. 8 exemplarily illustrates that the seventh to ninth single layer parts SLP7 to SLP9 have different widths from each other, but the inventive concepts are not limited thereto. For example, in some embodiments, at least two of the first to third widths W1 to W3 may have different values.

By adjusting the length and width of each of the single layer parts, it is possible to compensate for a difference in the line resistance value of reception trace lines caused by different total lengths of reception trace lines in each group.

Referring to FIGS. 9A and 9B, each of the seventh to ninth single layer parts SLP7 to SLP9 includes a first wiring layer WL11, and each of the seventh to ninth multilayer parts DLP7 to DLP9 includes the first wiring layer WL11 and a second wiring layer WL12. The seventh to ninth multilayer parts DLP7 to DLP9 may have the same width. However, the inventive concepts are not limited thereto. For example, in some embodiments, the seventh to ninth multilayer parts DLP7 to DLP9 in the same group may have different widths from each other.

The input detection layer ISP may include first and second insulating layers IL1 and IL2. The second wiring layer WL12 is disposed on the first insulating layer IL1, and the second wiring layer WL12 is covered by the second insulating layer IL2. The first wiring layer WL11 is disposed on the second insulating layer IL2. Reception sensing electrodes IE1-7 to IE1-9 (shown in FIG. 8) may be disposed on the second insulating layer IL2. More particularly, the seventh to ninth single layer parts SLP7 to SLP9 and the reception sensing electrodes IE1-7 to IE1-9 may be disposed on the same layer. When the seventh to ninth single layer parts SLP7 to SLP9 and the reception sensing electrodes IE1-7 to IE1-9 are disposed on the same layer, the seventh to ninth reception sensing electrodes IE1-7 to IE1-9 may be integrally formed with the seventh to ninth single layer parts SLP7 to SLP9, respectively.

The first and second wiring layers WL11 and WL12 in each of the seventh to ninth multilayer parts DLP7 to DLP9 may be electrically connected to each other. Each of the seventh to ninth multilayer parts DLP7 to DLP9 may be provided with at least one contact hole CNT. The first and second wiring layers WL11 and WL12 may be electrically connected to each other through the contact hole CNT.

FIG. 9A exemplarily illustrates a structures in which each of the seventh to ninth single layer parts SLP7 to SLP9 include the first wiring layer WL11, but the inventive concepts are not limited thereto. For example, in some embodiments, each of the seventh to ninth single layer parts SLP7 to SLP9 may include the second wiring layer WL12. In this case, the seventh to ninth single layer parts SLP7 to SLP9 may be disposed on a different layer from the reception sensing electrodes IE1-7 to IE1-9.

As shown in FIGS. 9A and 9B, each of the seventh to ninth single layer parts SLP7 to SLP9 includes one wiring layer (e.g., the first wiring layer WL11), and each of the seventh to ninth multilayer parts DLP7 to DLP9 includes at least two wiring layers (e.g., the first and the second wiring layers WL11 and WL12). As such, based on the same length of each of the reception trace line SL1-7 to SL1-9 shown in FIG. 8, the line resistance value of the single layer part may be greater than that of the multilayer part. When the length of the single layer part of the relatively short reception trace line is formed longer than the length of the single layer part of the relatively long reception trace line, the difference in line resistance of two reception trace lines of different lengths can be compensated. In addition, by adjusting the widths W1 to W3 in addition to the length of each of the seventh to ninth single layer parts SLP7 to SLP9, it is possible to compensate for the difference in the line resistance value of the reception trace lines.

Figure 10:
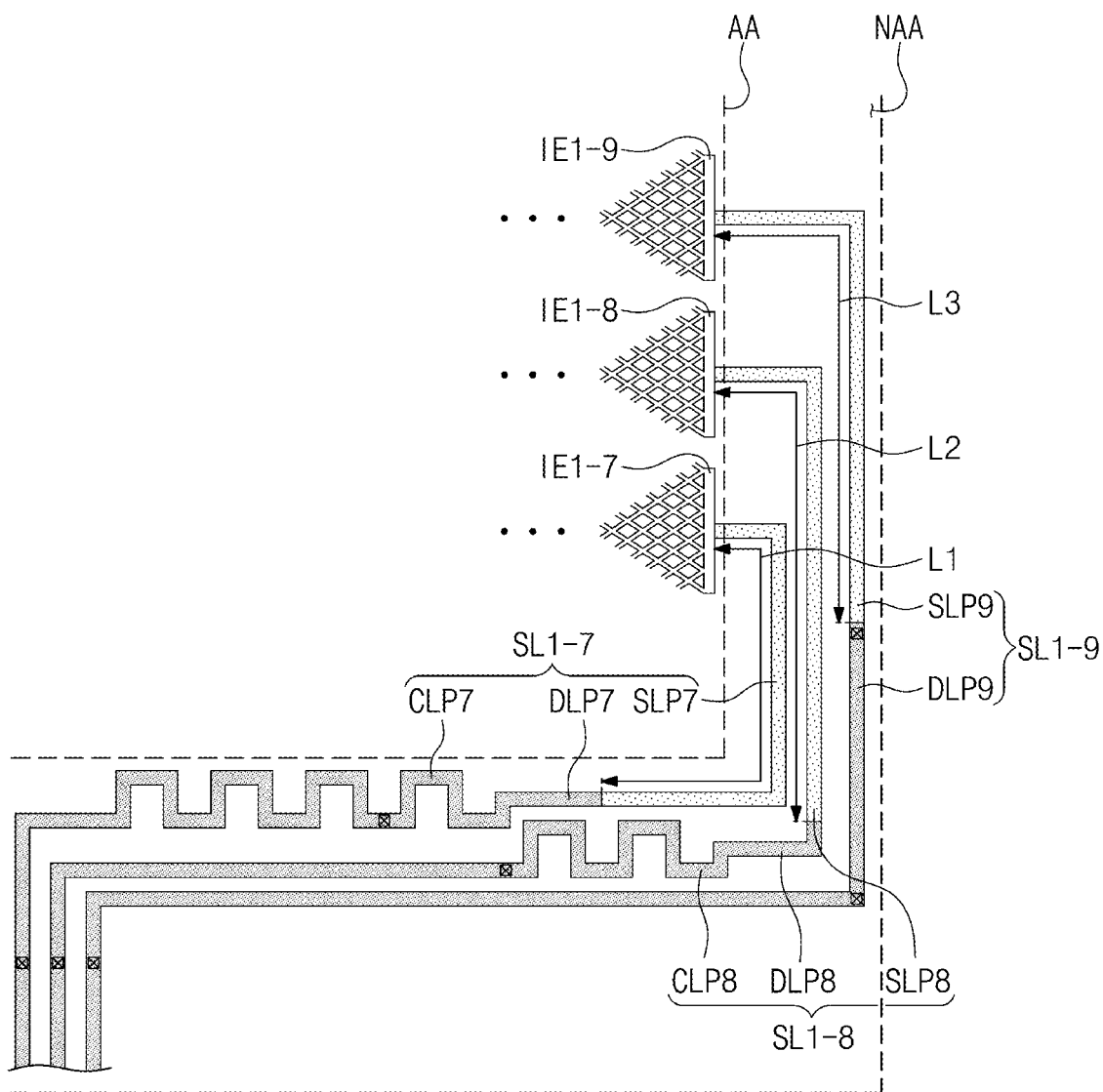
FIG. 10 is an enlarged plan view of a portion A1 shown in FIG. 7 according to an embodiment.

FIG. 10 is an enlarged plan view of portion A1 shown in FIG. 7 according to an embodiment.

Referring to FIGS. 7 and 10, the total lengths of the seventh to ninth reception trace lines SL1-7 to SL1-9 belonging to the same group (e.g., the third group SL1-G3) are different from each other. Each of the seventh to ninth reception trace lines SL1-7 to SL1-9 may include a single layer part and a multilayer part.

For example, the lengths of the single layer parts SLP7 to SLP9 of the seventh to ninth reception trace lines SL1-7 to SL1-9 may be the same as each other or different from each other. The seventh single layer part SLP7 has a first length L1, the eighth single layer part SLP8 has a second length L2, and the ninth single layer part SLP9 has a third length L3. The first to third lengths L1 to L3 may be the same as each other or different from each other. In FIG. 10, the first to third lengths L1 to L3 are exemplarily shown as being the same as each other, but the inventive concepts are not limited thereto.

The lengths of the multilayer parts DLP7 to DLP9 of the seventh to ninth reception trace lines SL1-7 to SL1-9 may be the same as each other or different from each other. For example, the seventh to ninth multilayer parts DLP7 to DLP9 have different lengths from each other. More particularly, the ninth multilayer part DLP9 has a greater length than the eighth multilayer part DLP8, and the eighth multilayer part DLP8 has a greater length than the seventh multilayer part DLP7. In order to compensate for the length difference between the seventh to ninth multilayer parts DLP7 to DLP9, the seventh reception trace line SL1-7 may include a first compensation part CLP7, and the eighth reception trace line SL1-8 may include a second compensation part CLP8. The first compensation part CLP7 may include a plurality of first bending patterns, and the second compensation part CLP8 may include a plurality of second bending patterns. The total length of the first compensation part CLP7 may be greater than the total length of the second compensation part CLP8. The first and second compensation parts CLP7 and CLP8 may have a multilayer structure similar to that of the seventh to ninth multilayer parts DLP7 to DLP9.

The sum of the lengths of the first compensation part CLP7 and the seventh multilayer part DLP7 may be equal to the sum of the lengths of the second compensation part CLP8 and the eighth multilayer part DLP8, and may be equal to the length of the ninth multilayer part DLP9. Therefore, the length difference between the seventh to ninth reception trace lines SL1-7 to SL1-9 can be compensated through the first and second compensation parts CLP7 and CLP8, and thus, a constant resistance design can be implemented by compensating for a difference in the line resistance value due to the length difference.

In FIG. 10, the first and second compensation parts CLP7 and CLP8 are exemplarily illustrated as being provided in a multi-layer structure to compensate for length differences between the seventh to ninth multilayer parts DLP7 to DLP9, but the inventive concepts are not limited thereto. For example, when the seventh to ninth multilayer parts DLP7 to DLP9 have the same length, and the seventh to ninth single layer parts SLP7 to SLP9 have different lengths, the first and second compensation parts CLP7 and CLP8 may be provided in a single layer structure to compensate for length differences between the seventh to ninth single layer parts SLP7 to SLP9.

Figure 11:
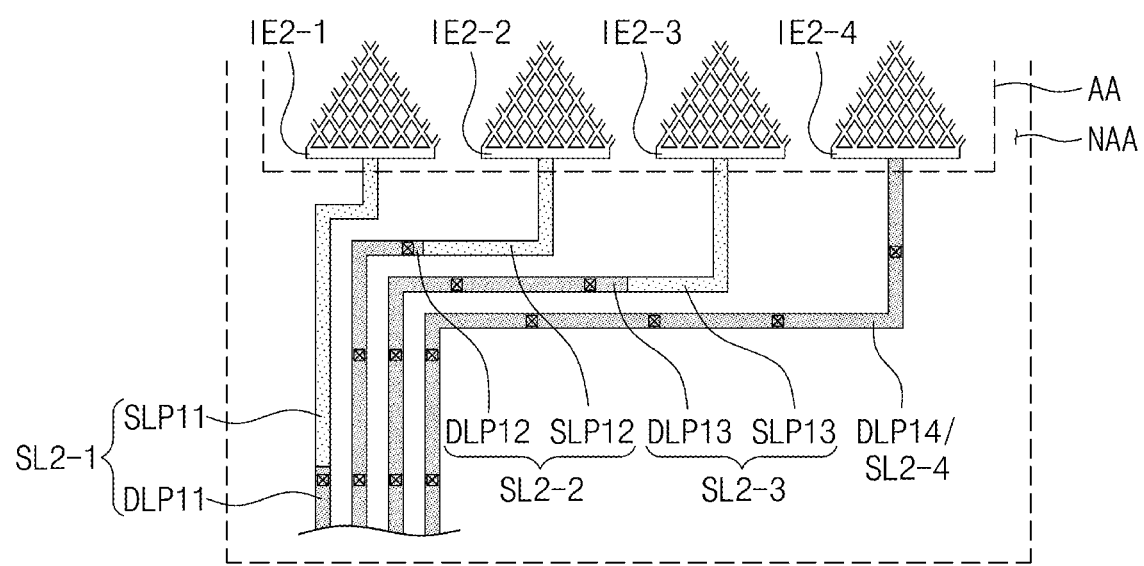
FIG. 11 is an enlarged plan view showing enlarged transmission trace lines shown in FIG. 4.

FIG. 11 is an enlarged plan view of transmission trace lines shown in FIG. 4.

Referring to FIGS. 4 and 11, since the transmission trace lines SL2-1 to SL2-4 are disposed closer to the input pads I-PD than the reception trace lines SL1-1 to SL1-5, the transmission trace lines SL2-1 to SL2-4 have a relatively shorter length than the reception trace lines SL1-1 to SL1-5. Also, a difference in length between the transmission trace lines SL2-1 to SL2-4 may be less than a difference in length between the reception trace lines SL1-1 to SL1-5. However, if the position of the input pads I-PD is changed, the length of the transmission trace lines SL2-1 to SL2-4 may have a relatively longer length than the length of the reception trace lines SL1-1 to SL1-5.

The transmission trace lines SL2-1 to SL2-4 may have different lengths from each other. In order to compensate for this length difference, at least some of the transmission trace lines SL2-1 to SL2-4 may include a single layer part and a multilayer part. For example, each of the first to third transmission trace lines SL2-1 to SL2-3 includes a single layer part and a multilayer part, and the fourth transmission trace line SL2-4 includes only the multilayer part.

The first transmission trace line SL2-1 includes a first single layer part SLP11 and a first multilayer part DLP11, the second transmission trace line SL2-2 includes a second single layer part SLP12 and a second multilayer part DLP12, and the third transmission trace line SL2-3 includes a third single layer part SLP13 and a third multilayer part DLP13. The fourth transmission trace line SL2-4 includes a fourth multilayer part DLP14.

The lengths of the first to third single layer parts SLP11 to SLP13 may be different from each other. More particularly, the length of the first to third single layer parts SLP11 to SLP13 may decrease in proportion to the length of their reception trace lines. For example, the lengths of the first single layer part SLP11 and the first multilayer part DLP11 of the first transmission trace lines SL2-1 are different from those of the second single layer part SLP12 and the second multilayer part DLP12 of the second transmission trace lines SL2-2. In this case, the length ratio of the first single layer part SLP11 and the first multilayer part DLP11 in the first transmission trace line SL2-1 may be different from the length ratio of the second single layer part SLP12 and the second multilayer part DLP12 in the second transmission trace line SL2-2. More particularly, if the length of the second transmission trace line SL2-2 is greater than the length of the first transmission trace line SL2-1, the ratio of the first single layer part SLP11 to the total length of the first transmission trace line SL2-1 may be larger than the ratio occupied by the second single layer part SLP12 in the entire length of the second transmission trace line SL2-2. The length ratio of the single layer part and the multilayer part in each transmission trace line is not particularly limited, and the line resistance values of the entire transmission trace lines can be set equally or evenly by adjusting the length ratio of single layer part and multilayer part in each transmission trace line. In addition, the length ratio of the single layer part and the multilayer part in each transmission trace line may be set differently according to the number of transmission trace lines SL2-1 to SL2-4, the size of the input detection layer ISP, and the like.

In this manner, even when each of the transmission trace lines SL2-1 to SL2-4 has a different length, each of the transmission trace lines SL2-1 to SL2-4 may be formed to have substantially the same level of line resistance (i.e., constant resistance design) by adjusting the length ratio of the single layer part of each transmission trace line SL2-1 to SL2-3. Accordingly, it is possible to prevent a decrease in sensing accuracy of the input detection layer ISP due to a difference in length of each of the transmission trace lines SL2-1 to SL2-4.

Figure 12:
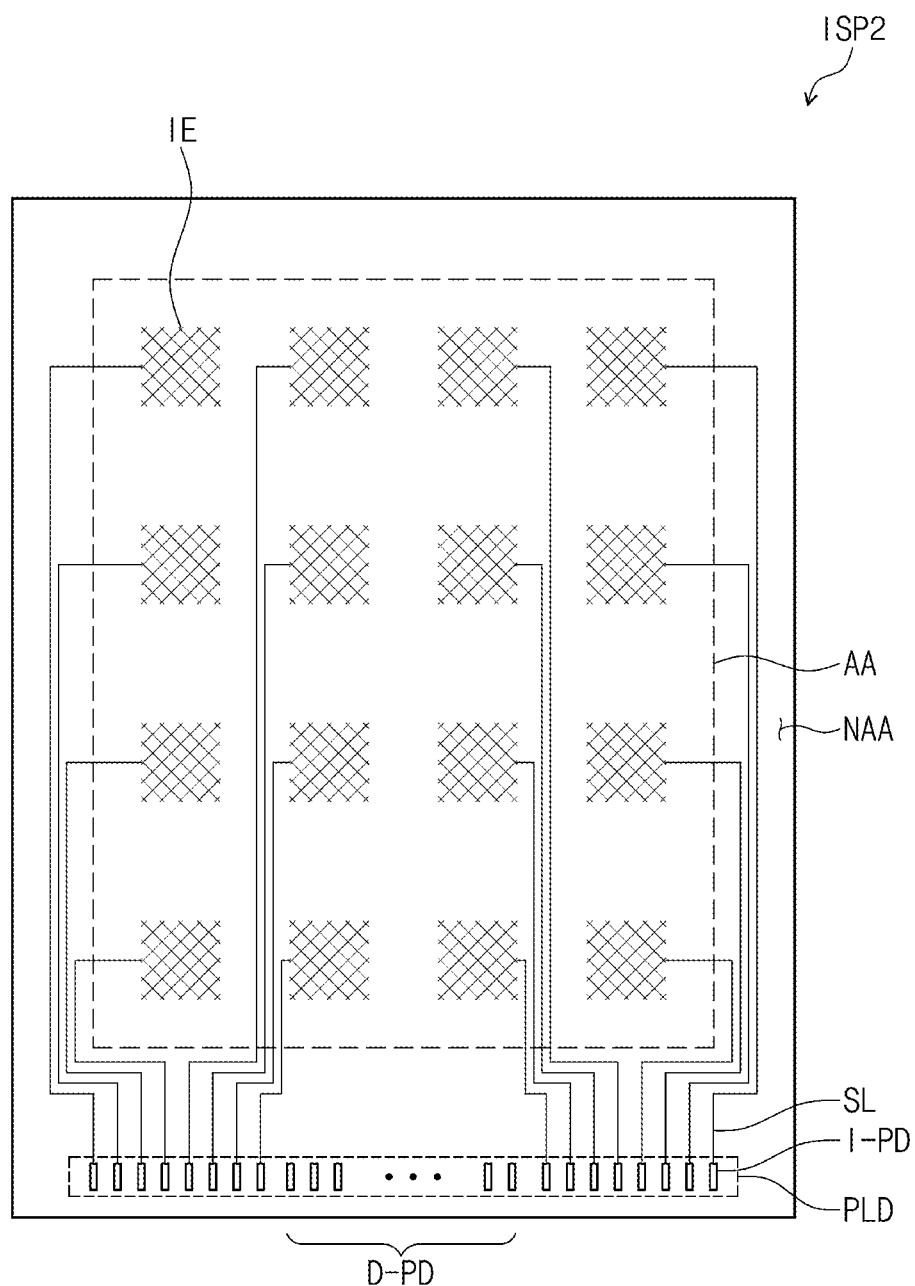
FIG. 12 is a plan view of an input detection layer according to an embodiment.

FIG. 12 is a plan view of an input detection layer according to an embodiment.

Referring to FIG. 12, an input detection layer ISP2 according to an embodiment may include a plurality of sensing electrodes IE and a plurality of trace lines SL. The sensing electrodes IE have unique coordinate information. For example, the sensing electrodes IE may be arranged in a matrix form, and are respectively connected to the trace lines SL. In the illustrated embodiment, each of the sensing electrodes IE may have a mesh shape.

The sensing electrodes IE and the trace lines SL may be disposed in the active area AA. A portion of the trace lines SL may be disposed in the active area AA, and another portion thereof may be disposed in the peripheral area NAA.

The input detection layer ISP2 according to the illustrated embodiment can obtain coordinate information in a self-capping manner.

The input detection layer ISP2 may include input pads I-PD extending from one end of the trace lines SL and disposed in the peripheral area NAA. The pad part PLD of the input detection layer ISP according to the illustrated embodiment may have a configuration similar to that of the pad part PLD of the input detection layer ISP shown in FIG. 3.

The trace lines SL may have different lengths. In order to compensate for the difference in lengths between the trace lines SL, some of the trace lines SL may include a single layer part and a multilayer part. The configuration of the trace lines SL including the single layer part and the multilayer part is similar to the configuration of the reception trace lines SL1-1 to SL1-5 and the transmission trace lines SL2-1 to SL2-4 described with reference to FIGS. 5 to 11. As such, repeated descriptions of the configuration of the trace lines SL including the single layer part and the multilayer part will be omitted.

In this manner, even when the input detection layer ISP2 is driven in a self-capacitance method, the trace lines SL having different lengths may be formed to have the same line resistance value (i.e., constant resistance design) by designing a part of the trace lines SL with a structure including a single layer part and a multilayer part.

Figure 13A:
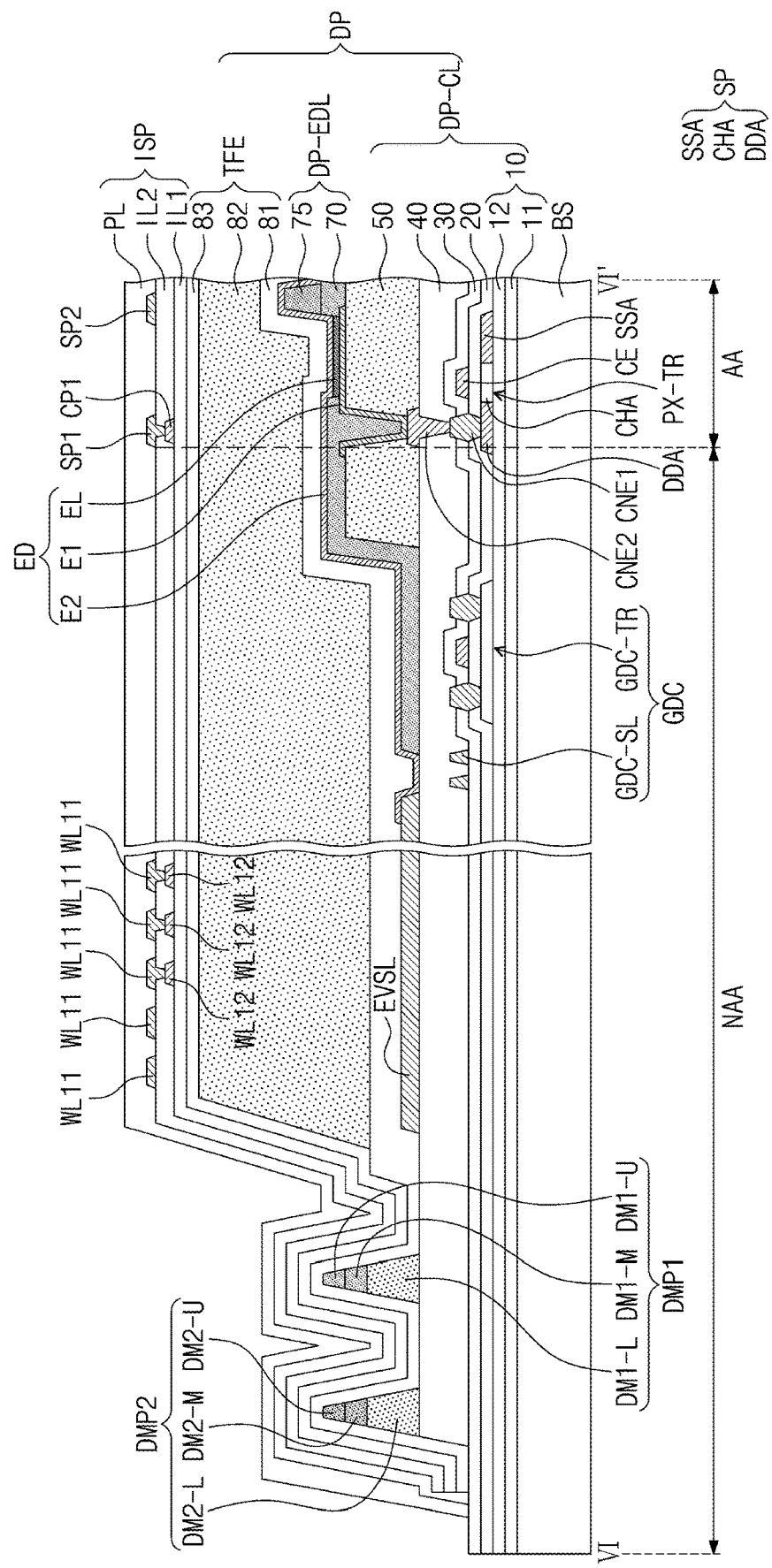
FIG. 13A is a cross-sectional view taken along the cutting line VI-VI' of a display module shown in FIG. 4.
Figure 13B:
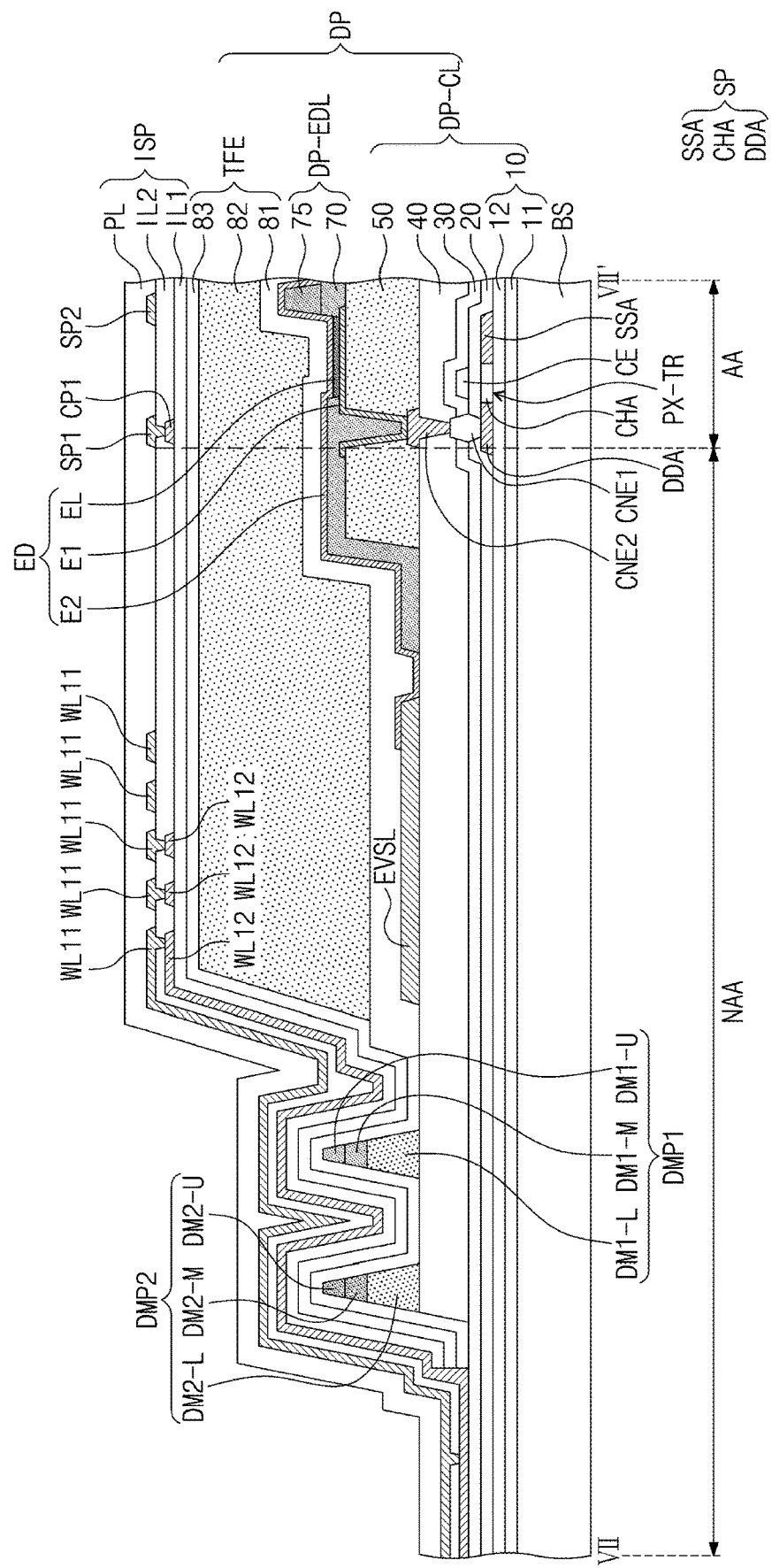
FIG. 13B is a cross-sectional view taken along the cutting line VII-VII' of a display module shown in FIG. 4.

FIG. 13A is a cross-sectional view taken along the cutting line VI-VI' of the display module shown in FIG. 4, and FIG. 13B is a cross-sectional view taken along the cutting line VII-VII' of the display module shown in FIG. 4.

Referring to FIGS. 13A and 13B, the display panel DP includes a base layer BS, a circuit element layer DP-CL, a light emitting element layer DP-EDL, and an encapsulation layer TFE. In an embodiment, the base layer BS, the circuit element layer DP-CL, the light emitting element layer DP-EDL, and the encapsulation layer TFE may be sequentially stacked in the third direction DR3 shown in FIG. 2.

The base layer BS may be a member that provides a base surface on which the circuit element layer DP-CL is disposed. The base layer BS may include a glass substrate, a metal substrate, a plastic substrate, or the like. However, the inventive concepts are not limited thereto, and the base layer BS may include an inorganic layer, an organic layer or a composite layer in other embodiments.

The circuit element layer DP-CL is disposed on the base layer BS. The circuit element layer DP-CL may include a pixel driving circuit, such as pixel transistors PX-TR. In FIGS. 13A and 13B, only one pixel transistor PX-TR is exemplarily illustrated for convenience of description.

The circuit element layer DP-CL further includes first to fifth panel insulating layers 10, 20, 30, 40, and 50 stacked in the third direction DR3. The first panel insulating layer 10 is disposed on the base layer BS. The first panel insulating layer 10 may include a barrier layer 11 and a buffer layer 12.

The barrier layer 11 may include an inorganic material. The barrier layer 11 may prevent oxygen or moisture flowing through the base layer BS from penetrating the pixels PX (see FIG. 3). The buffer layer 12 may include an inorganic material. The buffer layer 12 may provide a lower surface energy to the pixels PX than the base layer BS so that the pixels PX may be stably formed on the base layer BS. In FIGS. 13A and 13B, each of the barrier layer 11 and the buffer layer 12 are exemplarily shown as a single layer. However, in some embodiments, the barrier layer 11 and the buffer layer 12 may be provided in plural and may be alternately stacked with each other. Alternatively, at least one of the barrier layer 11 and the buffer layer 12 may be provided in plural or may be omitted.

The pixel transistor PX-TR may be disposed on the first panel insulating layer 10. The pixel transistor PX-TR includes a semiconductor pattern SP and a control electrode CE. The semiconductor pattern SP is disposed on the first panel insulating layer 10. The semiconductor pattern SP may include a semiconductor material. The semiconductor pattern SP may include a channel part CHA, a source part SSA, and a drain part DDA. The semiconductor pattern SP is covered by the second panel insulating layer 20, and the control electrode CE may be disposed on the second panel insulating layer 20. The control electrode CE is disposed on the second panel insulating layer 20 and overlap the channel part CHA of the semiconductor pattern SP. In particular, the control electrode CE and the channel part CHA of the semiconductor pattern SP are spaced by the second panel insulating layer 20.

The source part SSA and the drain part DDA of the semiconductor pattern SP may be spaced apart from each other with the channel part CHA therebetween. The source part SSA of the semiconductor pattern SP may be used as an input electrode of the pixel transistor PX-TR, and the drain part DDA of the semiconductor pattern SP may be used as an output electrode of the pixel transistor PX-TR.

The third panel insulating layer 30 is disposed on the control electrode CE and the second panel insulating layer 20. Contact holes for exposing the drain part DDA of the semiconductor pattern SP may be provided in the second and third panel insulating layers 20 and 30. A first connection electrode CNE1 connected to the drain part DDA through the contact hole may be disposed on the third panel insulating layer 30. As another example, the pixel transistors PX-TR in FIGS. 13A and 13B may further include an input electrode and an output electrode connected to the source part SSA and the drain part DDA of the semiconductor pattern SP, respectively.

The fourth panel insulating layer 40 is disposed on the third panel insulating layer 30. The fourth panel insulating layer 40 may include an organic material and/or an inorganic material, and may have a single layer or a laminated structure.

A second connection electrode CNE2 may be disposed on the fourth panel insulating layer 40. The second connection electrode CNE2 may be connected to the first connection electrode CNE1. A fifth panel insulating layer 50 may be disposed on the second connection electrode CNE2.

The inventive concepts are not limited to the structure of the pixel transistor PX-TR shown in FIGS. 13A and 13B, and the pixel transistor PX-TR may be formed in various structures in other embodiments.

The circuit element layer DP-CL further includes a source power line EVSL and the driving circuit GDC which are disposed in the peripheral area NAA. The driving circuit GDC may include driving signal lines GDC-SL and driving transistors GDC-TR.

The light emitting element layer DP-EDL is disposed on the circuit element layer DP-CL. The light emitting element layer DP-EDL may include a plurality of light emitting elements ED.

The light emitting elements ED are disposed on the fifth panel insulating layer 50. Each of the light emitting elements ED may include a first electrode E1, a light emitting layer EL, and a second electrode E2. The first electrode E1 may penetrate the fifth panel insulating layer 50 and be electrically connected to the pixel transistor PX-TR through the second connection electrode CNE2.

A pixel defining film 70 may be disposed on the fifth panel insulating layer 50. An opening part is defined in the pixel defining film 70, and the opening part may expose at least a portion of the first electrode E1.

The light emitting layer EL may be disposed on the first electrode E1 exposed by the opening part defined in the pixel defining film 70. The light emitting layer EL may include a luminescent material. For example, the light emitting layer EL may include at least one of materials emitting red, green, and blue light. The light emitting layer EL may include a fluorescent material or a phosphorescent material. The light emitting layer EL may include an organic light emitting material or an inorganic light emitting material. The light emitting layer EL may emit light in response to a potential difference between the first electrode E1 and the second electrode E2.

The second electrode E2 may be disposed on the light emitting layer EL. The second electrode E2 may be provided commonly to a plurality of pixels PX. The second electrode E2 may have a shape corresponding to the active area AA (see FIG. 3).

The second electrode E2 may include a transparent conductive material or a semi-transparent conductive material. Accordingly, light generated in the light emitting layer EL can be easily emitted toward the third direction DR3 through the second electrode E2. However, the inventive concepts are not limited thereto. Depending on the design, the light emitting elements ED according to an embodiment may be driven in the rear surface light-emission system, in which the first electrode E1 includes a transparent or semi-transparent material, or may be driven in a double-sided light-emission system in which light is emitted towards both front and rear surfaces, without being limited thereto.

The second electrode E2 may is connected to the source power line EVSL in the peripheral area NAA.

The encapsulation layer TFE may be disposed on the light emitting element layer DP-EDL to seal the light emitting elements ED. The encapsulation layer TFE may cover the active area AA as a whole. The encapsulation layer TFE may cover some areas of the peripheral area NAA.

The encapsulation layer TFE may include a first inorganic layer 81, an organic layer 82, and a second inorganic layer 83 sequentially stacked along the third direction DR3. In the illustrated embodiment, each of the first inorganic layer 81, the organic layer 82, and the second inorganic layer 83 is shown as a single layer. However, in another embodiment, at least one of the first inorganic layer 81, the organic layer 82, and the second inorganic layer 83 may be provided in plural or may be omitted, without being limited thereto.

The first inorganic layer 81 may cover the second electrode E2. The first inorganic layer 81 can prevent external moisture or oxygen from penetrating the light emitting elements ED. For example, the first inorganic layer 81 may include silicon nitride, silicon oxide, or a combination thereof. The first inorganic layer 81 may be formed through a deposition process.

The organic layer 82 can be disposed on the first inorganic layer 81 and contact the first inorganic layer 81. The organic layer 82 can provide a flat surface on the first inorganic layer 81. In particular, the organic layer 82 can provide a flat surface to the active area AA.

The curve that may be formed on the upper surface of the first inorganic layer 81 and the particles existing on the first inorganic layer 81 are covered by the organic layer 82, so as to prevent the influence of the surface state of the upper surface of the first inorganic layer 81 on the structures formed on the organic layer 82. Further, the organic layer 82 can relieve the stress between the contacting layers. The organic layer 82 may include an organic material, and may be formed through a solution process, such as a spin coating process, a slit coating process, or an ink jet process.

The second inorganic layer 83 is disposed on the organic layer 82 to cover the organic layer 82. The second inorganic layer 83 can be stably formed on a relatively flat surface as compared to being disposed on the first inorganic layer 81. The second inorganic layer 83 seals the organic layer 82 to prevent moisture or the like therefrom being discharged to the outside. The second inorganic layer 83 may include silicon nitride, silicon oxide, or a combination thereof. The second inorganic layer 83 may be formed through a deposition process, for example.

Referring to FIGS. 4 and 13A, the input detection layer ISP includes a first conductive layer, a second conductive layer, a first wiring layer WL11, a second wiring layer WL12, a first insulating layer IL1, and a second insulating layer IL2. The first insulating layer IL1 is disposed on the display panel DP. In particular, the first insulating layer IL1 may be directly formed on the encapsulation layer TFE through a continuous process. The first conductive layer may include at least one of the first and second sensor parts SP1 and SP2 and the first and second connection parts CP1 and CP2. For example, the first conductive layer may include a first connection part CP1. The first conductive layer is disposed on the first insulating layer IL1 and is covered by the second insulating layer IL2.

The second conductive layer is disposed on the second insulating layer IL2. The second conductive layer may include at least one of the first and second sensor parts SP1 and SP2 and the first and second connection parts CP1 and CP2. For example, the second conductive layer may include first and second sensor parts SP1 and SP2 and a second connection part CP2. A contact hole for connecting the first connection part CP1 and the first sensor part SP1 may be formed in the second insulating layer IL2.

The first and second insulating layers IL1 and IL2 have insulating properties and may be optically transparent. The first and second insulating layers IL1 and IL2 may include at least one inorganic layer and/or organic layer.

Some of the reception trace lines SL1-1 to SL1-5 and the transmission trace lines SL2-1 to SL2-4 include a single layer part and a multilayer part. The single layer part has a single layer structure including one of the first wiring layer WL11 and the second wiring layer WL12, and the multilayer part has a dual wiring structure including the first wiring layer WL11 and the second wiring layer WL12.

The first wiring layer WL11 and the second conductive layer are disposed on the same layer, and the second wiring layer WL12 and the first conductive layer are disposed on the same layer. More particularly, the first conductive layer and the second wiring layer WL12 are formed on the first insulating layer IL1 through the same process, and the second conductive layer and the first wiring layer WL11 are formed on the second insulating layer IL2 through the same process. In the multilayer part, the first wiring layer WL11 may contact the corresponding second wiring layer WL12 through the contact hole CNT (see FIGS. 6A and 6B) formed in the second insulating layer IL2.

The input detection layer ISP may further include a protective layer PL covering the second conductive layer and the first wiring layer WL11. The protective layer PL may include an inorganic layer and/or an organic layer.

The display panel DP may further include a first dam part DMP1 and a second dam part DMP2 disposed in the peripheral area NAA. As shown in FIGS. 13A and 13B, the first and second dam parts DMP1 and DMP2 may have a multilayer structure. The second dam part DMP2 may be disposed further outside than the first dam part DMP1. The first dam part DMP1 includes a first lower dam DM1-L, a first intermediate dam DM1-M, and a first upper dam DM1-U. The second dam part DMP2 includes a second lower dam DM2-L, a second intermediate dam DM2-M, and a second upper dam DM2-U.

The first and second lower dams DM1-L and DM2-L may be formed simultaneously with the fifth panel insulating layer 50. The first and second intermediate dams DM1-M and DM2-M are provided on the first and second lower dams DM1-L and DM2-L, respectively. The first and second intermediate dams DM1-M and DM2-M may be formed simultaneously with the pixel defining film 70. The first and second upper dams DM1-U and DM2-U are provided on the first and second intermediate dams DM1-M and DM2-M, respectively. A dummy insulating layer 75 may be further provided on the pixel defining film 70 in the active area AA. The first and second upper dams DM1-U and DM2-U are formed simultaneously with the dummy insulating layer 75.

The first and second dam parts DMP1 and DMP2 may be provided with a closed loop shape in the peripheral area NAA to surround the active area AA. Accordingly, the first and second dam parts DMP1 and DMP2 prevent the liquid organic material from spreading outward in the process of forming the organic layer 82 of the encapsulation layer TFE. The organic layer 82 may be formed by coating a liquid organic material on the first inorganic layer 81 through an inkjet method, and this case, the first and second dam parts DMP1 and DMP2 may set a boundary of an area where a liquid organic material is to be disposed.

FIGS. 13A and 13B exemplarily illustrate a structure including the first and second dam parts DMP1 and DMP2, but the inventive concepts are not limited thereto. For example, the display panel DP in other embodiments may include only one of the first and second dam parts DMP1 and DMP2. Also, although each of the first and second dam parts DMP1 and DMP2 is shown to have a triple film structure, in some embodiments, at least one of the first and second dam parts DMP1 and DMP2 may have a double film structure.

The first inorganic layer 81 and the second inorganic layer 83 may contact each other on the first and second dam parts DMP1 and DMP2. Since the organic layer 82 is disposed inside the area defined by the first and second dam parts DMP1 and DMP2, the first inorganic layer 81 and the second inorganic layer 83 may contact each other on the first and second dam parts DMP1 and DMP2 to seal the organic layer 82.

The first and second inorganic layers 81 and 83 in the encapsulation layer TFE extend outside the first and second dam parts DMP1 and DMP2, and one ends of the reception trace lines SL1-1 to SL1-5 and the transmission trace lines SL2-1 to SL2-4 extend along the second inorganic layer 83 to the outside of the organic layer 82 and the first and second dam parts DMP1 and DMP2.

One ends of the reception trace lines SL1-1 to SL1-5 and the transmission trace lines SL2-1 to SL2-4 extending to the outside of the first and second dam parts DMP1 and DMP2 are electrically connected to the input pads I-PD of the pad part PLD.

In the display device according to embodiment, some of the trace lines disposed in the input detection layer include a single layer part and a multilayer part. As such, even when each of the trace lines has a different length, each of the trace lines can be formed to have the same level or a uniform line resistance value by adjusting the length ratio of the single layer part of each trace line. Accordingly, it is possible to prevent a decrease in sensing accuracy of the input detection layer due to a difference in length of each of the trace lines.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a light emitting element configured to generate light; and
an input detection layer disposed on the display panel and including:
a plurality of sensing electrodes disposed on the display panel and arranged in one direction; and
a plurality of trace lines electrically connected to the plurality of sensing electrodes, respectively,
wherein at least one of the trace lines comprises:
a single layer part including one conductive layer; and
a multilayer part including at least two conductive layers disposed on different layers,
wherein a length of an $i^{th}$ trace line among the trace lines and a length of a $j^{th}$ trace line among the trace lines are different from each other,
wherein each of the $i^{th}$ trace line and the $j^{th}$ trace line comprises the single layer part and the multilayer part, and
wherein a length of the single layer part of the $i^{th}$ trace line is substantially equal to a length of the single layer part of the $j^{th}$ trace line, and a length of the multilayer part of the $i^{th}$ trace line is different from a length of the multilayer part of the $j^{th}$ trace line.

2. The display device of claim 1, wherein:
a total length of the $j^{th}$ trace line is greater than a total length of the $i^{th}$ trace line; and
the length of the multilayer part of the $j^{th}$ trace line is greater than the length of the multilayer part of the $i^{th}$ trace line.

3. The display device of claim 1, wherein:
the trace lines are grouped into a plurality of groups;
each of the trace lines of a first group among the groups comprises the single layer part and the multilayer part; and
a length of the single layer part of each of the trace lines of the first group is the same.

4. The display device of claim 3, wherein:
the trace lines of the first group include the $j^{th}$ trace line and the $i^{th}$ trace line; and
a width of the single layer part of the $j^{th}$ trace line is different from a width of the single layer part of the $i^{th}$ trace line.

5. The display device of claim 4, wherein:
a length of the $j^{th}$ trace line is greater than a length of the $i^{th}$ trace line; and
the width of the single layer part of the $i^{th}$ trace line is less than the width of the single layer part of the $j^{th}$ trace line.

6. The display device of claim 3, wherein at least one of the trace lines of the first group further comprises a compensation part.

7. The display device of claim 6, wherein:
the trace lines of the first group include the $j^{th}$ trace line and the $i^{th}$ trace line each comprising the compensation part;

a length of the $j^{th}$ trace line is greater than a length of the $i^{th}$ trace line; and
a length of the compensation part of the $i^{th}$ trace line is greater than a length of the compensation part of the $j^{th}$ trace line.

8. The display device of claim 1, wherein the input detection layer further comprises:
a first insulating layer; and
a second insulating layer disposed on the first insulating layer.

9. The display device of claim 8, wherein:
the multilayer part comprises a first wiring layer disposed on the second insulating layer and a second wiring layer disposed on the first insulating layer; and
the single layer part comprises one of the first or second wiring layers.

10. The display device of claim 9, wherein the multilayer part comprises a contact portion where the first wiring layer and the second wiring layer are connected.

11. The display device of claim 9, wherein:
each of the sensing electrodes is disposed on the second insulating layer;
the single layer part comprises the first wiring layer; and
the first wiring layer is integrally formed with the sensing electrodes.

12. The display device of claim 1, wherein:
the display panel further comprises an encapsulation layer covering the light emitting element; and
the input detection layer is disposed directly on the encapsulation layer.

13. The display device of claim 12, wherein the encapsulation layer comprises:
a first inorganic layer;
an organic layer disposed on the first inorganic layer; and
a second inorganic layer disposed on the organic layer and contacting the first inorganic layer to seal the organic layer, and
wherein one end of the trace lines extends along the second inorganic layer and is disposed outside the organic layer.

14. The display device of claim 13, wherein:
the input detection layer further comprises a first insulating layer disposed on the second inorganic layer, and a second insulating layer disposed on the first insulating layer;
the multilayer part comprises a first wiring layer disposed on the second insulating layer and a second wiring layer disposed on the first insulating layer; and
the single layer part comprises one of the first or second wiring layers.

15. The display device of claim 12, wherein:
the display panel comprises an active area to display an image and a peripheral area disposed outside the active area;
the sensing electrodes are disposed in the active area; and
the trace lines are disposed in the peripheral area.

16. A display device comprising:
a display panel including a light emitting element configured to generate light; and
an input detection layer disposed on the display panel, and including:
a plurality of first sensing electrodes disposed on the display panel, extending in a first direction, and arranged in a second direction intersecting the first direction;

a plurality of second sensing electrodes disposed on the display panel, extending in the second direction, and arranged in the first direction;

a plurality of first trace lines electrically connected to the first sensing electrodes, respectively; and a plurality of second trace lines electrically connected to the second sensing electrodes, respectively, wherein at least one of the first or second trace lines comprises:

a single layer part including one wiring layer; and a multilayer part including at least two wiring layers disposed on different layers, wherein a length of an $i^{th}$ trace line among the first and second trace lines and a length of a $j^{th}$ trace line among the first and second trace lines are different from each other, wherein each of the $i^{th}$ trace line and the $j^{th}$ trace line comprises the single layer part and the multilayer part, and wherein a length of the single layer part of the $i^{th}$ trace line is substantially equal to a length of the single layer part of the $j^{th}$ trace line, and a length of the multilayer part of the $i^{th}$ trace line is different from a length of the multilayer part of the $j^{th}$ trace line.

17. The display device of claim 16, wherein:

a total length of the $j^{th}$ trace line is greater than a total length of the $i^{th}$ trace line; and the length of the multilayer part of the $j^{th}$ trace line is greater than the length of the multilayer part of the $i^{th}$ trace line.

* * * * *